US012588433B2

(12) United States Patent
Han et al.

(10) Patent No.: US 12,588,433 B2
(45) Date of Patent: Mar. 24, 2026

(54) POROUS III-NITRIDES AND METHODS OF USING AND MAKING THEREOF

(71) Applicant: Yale University, New Haven, CT (US)

(72) Inventors: Jung Han, New Haven, CT (US);
Kanglin Xiong, New Haven, CT (US);
Ge Yuan, New Haven, CT (US);
Cheng Zhang, New Haven, CT (US)

(73) Assignee: Yale University, New Haven, CT (US)

( * ) Notice: Subject to any disclaimer, the term of this patent is extended or adjusted under 35 U.S.C. 154(b) by 150 days.

(21) Appl. No.: 17/773,332

(22) PCT Filed: Oct. 30, 2020

(86) PCT No.: PCT/US2020/058295
§ 371 (c)(1),
(2) Date: Apr. 29, 2022

(87) PCT Pub. No.: WO2021/087315
PCT Pub. Date: May 6, 2021

(65) Prior Publication Data
US 2022/0384187 A1      Dec. 1, 2022

Related U.S. Application Data

(60) Provisional application No. 62/928,882, filed on Oct. 31, 2019.

(51) Int. Cl.
*H01L 21/02* (2006.01)
*H01L 21/306* (2006.01)

(52) U.S. Cl.
CPC .................. *H01L 21/02458* (2013.01); *H01L 21/02381* (2013.01); *H01L 21/02505* (2013.01);
(Continued)

(58) Field of Classification Search
CPC ......... H01L 21/02458; H01L 21/02381; H01L 21/02505; H01L 21/02576; H01L 21/0262;
(Continued)

(56) References Cited

U.S. PATENT DOCUMENTS

| | | | |
|---|---|---|---|
| 5,262,021 A | 11/1993 | Lehmann | |
| 5,307,361 A | 4/1994 | Kahen | |
| 5,502,787 A | 3/1996 | Capasso | |
| 5,509,026 A | 4/1996 | Sasaki | |
| 5,644,156 A | 7/1997 | Suzuki | |

(Continued)

FOREIGN PATENT DOCUMENTS

| | | |
|---|---|---|
| CN | 101443887 | 5/2009 |
| CN | 102782818 | 11/2012 |

(Continued)

OTHER PUBLICATIONS

Al-Heuseen, et al., "Effect of different electrolytes on porous GaN using photo-electrochemical etching", Appl. Surf. Sci., 257:6197-6201 (2011).

(Continued)

*Primary Examiner* — Julio J Maldonado
*Assistant Examiner* — Nathan Pridemore
(74) *Attorney, Agent, or Firm* — Pabst Patent Group LLP

(57) ABSTRACT

Porous III-nitrides having controlled/tuned optical, electrical, and thermal properties are described herein. Also disclosed are methods for preparing and using such porous III-nitrides.

20 Claims, 21 Drawing Sheets

(52) U.S. Cl.
CPC .... *H01L 21/02576* (2013.01); *H01L 21/0262* (2013.01); *H01L 21/306* (2013.01)

(58) Field of Classification Search
CPC .............. H01L 21/306; H01L 21/02502; H01L 21/0242; H01L 21/0254; H01L 21/30635; H01L 21/02513; H01L 21/0251; Y02P 20/133; H01S 5/18361; H01S 5/32341; H10H 20/8142

See application file for complete search history.

(56) References Cited

U.S. PATENT DOCUMENTS

| | | |
|---|---|---|
| 5,818,861 A | 10/1998 | Tan |
| 5,919,430 A | 7/1999 | Hasenzahl |
| 6,306,672 B1 | 10/2001 | Kim |
| 6,320,206 B1 | 11/2001 | Coman |
| 6,537,838 B2 | 3/2003 | Stockman |
| 6,597,017 B1 | 7/2003 | Seko |
| 6,597,490 B2 | 7/2003 | Tayebati |
| 6,759,310 B2 | 7/2004 | Tayanaka |
| 6,990,132 B2 | 1/2006 | Kneissl |
| 7,271,417 B2 | 9/2007 | Chen |
| 7,750,234 B2 | 7/2010 | Deng |
| 7,751,455 B2 | 7/2010 | Kneissl |
| 7,923,275 B2 | 4/2011 | Nakagawa |
| 7,989,323 B2 | 8/2011 | Shenai-Khatkhate |
| 8,343,788 B2 | 1/2013 | Kuo |
| 8,344,409 B2 | 1/2013 | Peng |
| 8,497,171 B1 | 7/2013 | Wu |
| 8,507,925 B2 | 8/2013 | Kuo |
| 8,519,430 B2 | 8/2013 | Peng |
| 9,206,524 B2 | 12/2015 | Zhang |
| 9,356,187 B2 | 5/2016 | Ryu |
| 9,388,695 B2 | 7/2016 | Daouk |
| 9,583,353 B2 | 2/2017 | Han |
| 10,458,038 B2 | 10/2019 | Zhang |
| 11,018,231 B2 | 5/2021 | Han |
| 11,043,792 B2 | 6/2021 | Han |
| 2002/0036295 A1 | 3/2002 | Nunoue |
| 2002/0070125 A1 | 6/2002 | Ng |
| 2002/0075929 A1 | 6/2002 | Cunningham |
| 2002/0085610 A1 | 7/2002 | Morgan |
| 2002/0153595 A1 | 10/2002 | Tayanaka |
| 2002/0158265 A1 | 10/2002 | Eisenbeiser |
| 2003/0178633 A1 | 9/2003 | Flynn |
| 2003/0189963 A1 | 10/2003 | Deppe |
| 2004/0021147 A1 | 2/2004 | Ishibashi |
| 2004/0104398 A1 | 6/2004 | Hon |
| 2005/0029224 A1 | 2/2005 | Aspar |
| 2005/0184307 A1 | 8/2005 | Li |
| 2005/0224816 A1 | 10/2005 | Kim |
| 2005/0242365 A1 | 11/2005 | Yoo |
| 2006/0046513 A1 | 3/2006 | Shea |
| 2006/0110926 A1 | 5/2006 | Hu |
| 2006/0199353 A1 | 9/2006 | Kub |
| 2007/0004162 A1 | 1/2007 | Tang |
| 2007/0007241 A1 | 1/2007 | DeLouise |
| 2007/0085100 A1 | 4/2007 | Diana |
| 2007/0111345 A1 | 5/2007 | Wong |
| 2007/0194330 A1 | 8/2007 | Ibbetson |
| 2007/0284607 A1 | 12/2007 | Epler |
| 2008/0029773 A1 | 2/2008 | Jorgenson |
| 2008/0067532 A1 | 3/2008 | Watson |
| 2008/0179605 A1 | 7/2008 | Takase |
| 2008/0280140 A1 | 11/2008 | Ferrari |
| 2008/0285610 A1 | 11/2008 | Hall |
| 2008/0296173 A1 | 12/2008 | Mishra |
| 2008/0298419 A1 | 12/2008 | Hori |
| 2009/0001416 A1 | 1/2009 | Chua |
| 2009/0117675 A1 | 5/2009 | Yamanaka |
| 2009/0140274 A1 | 6/2009 | Wierer, Jr. |
| 2009/0143227 A1 | 6/2009 | Dubrow |
| 2009/0168819 A1 | 7/2009 | Otoma |
| 2010/0195689 A1 | 8/2010 | Ariga |

| | | |
|---|---|---|
| 2010/0246625 A1 | 9/2010 | Kawashima |
| 2010/0270649 A1 | 10/2010 | Ishibashi |
| 2010/0317132 A1 | 12/2010 | Rogers |
| 2011/0076854 A1 | 3/2011 | Takeo |
| 2011/0101391 A1 | 5/2011 | Miki |
| 2011/0140083 A1* | 6/2011 | Driscoll ............. H01L 21/0237 257/15 |
| 2011/0188528 A1 | 8/2011 | Kisin |
| 2012/0018753 A1 | 1/2012 | Hao |
| 2012/0025231 A1 | 2/2012 | Krames |
| 2012/0068214 A1 | 3/2012 | Kuo |
| 2012/0189030 A1 | 7/2012 | Miyoshi |
| 2013/0011656 A1* | 1/2013 | Zhang ....................... C25F 3/12 205/684 |
| 2013/0050686 A1 | 2/2013 | Wunderer |
| 2013/0134457 A1 | 5/2013 | Peng |
| 2013/0140517 A1 | 6/2013 | Tang |
| 2013/0210180 A1 | 8/2013 | Wang |
| 2013/0248911 A1 | 9/2013 | Hwang |
| 2013/0328102 A1 | 12/2013 | Peng |
| 2013/0334555 A1 | 12/2013 | Hsieh |
| 2014/0003458 A1 | 1/2014 | Han |
| 2014/0048830 A1 | 2/2014 | Kuo |
| 2014/0064313 A1 | 3/2014 | Sato |
| 2014/0191369 A1 | 7/2014 | Tsuchiya |
| 2014/0203292 A1 | 7/2014 | Hwang |
| 2014/0339566 A1 | 11/2014 | Seo |
| 2015/0303655 A1 | 10/2015 | Han |
| 2016/0153113 A1 | 6/2016 | Zhang |
| 2016/0197151 A1 | 7/2016 | Han |
| 2017/0133826 A1 | 5/2017 | Han |
| 2017/0237234 A1* | 8/2017 | Han ...................... H01S 5/1042 372/45.012 |
| 2018/0101016 A1 | 4/2018 | Enzmann |
| 2018/0152003 A1* | 5/2018 | Han ...................... H01S 5/2009 |
| 2023/0052931 A1* | 2/2023 | Han .................... H01L 29/003 |
| 2024/0222937 A1 | 7/2024 | Han et al. |

FOREIGN PATENT DOCUMENTS

| | | |
|---|---|---|
| CN | 103762286 | 4/2014 |
| EP | 1320157 | 6/2003 |
| JP | H05315316 | 11/1993 |
| JP | H10135500 | 5/1998 |
| JP | H11195562 | 7/1999 |
| JP | 2001223165 | 8/2001 |
| JP | 2004055611 | 2/2004 |
| JP | 2005244089 | 9/2005 |
| JP | 2007073945 | 3/2007 |
| JP | 2007518075 | 7/2007 |
| JP | 2007335879 | 12/2007 |
| JP | 2009055056 | 3/2009 |
| JP | 2009067658 | 4/2009 |
| JP | 2009231833 | 10/2009 |
| JP | 2009239034 | 10/2009 |
| JP | 2010218510 | 9/2010 |
| JP | 2014507069 A | 3/2014 |
| JP | 2018502436 A | 1/2018 |
| JP | 2018517295 A | 6/2018 |
| KR | 20000038997 | 7/2000 |
| KR | 100480764 | 6/2005 |
| WO | 2005066612 | 7/2005 |
| WO | 2009048265 | 4/2009 |
| WO | 2011046244 | 4/2011 |
| WO | 2011094391 | 8/2011 |
| WO | 2014004261 | 1/2014 |
| WO | 2016054232 | 4/2016 |
| WO | 2016187421 | 11/2016 |
| WO | 2021150304 | 7/2021 |
| WO | 2022235615 | 11/2022 |

OTHER PUBLICATIONS

Amano, et al., "P-Type Conduction in Mg-Doped GaN Treated with Low-Energy Electron Beam Irradiation (LEEBI)", Jpn. J. Appl. Phys., 28:L2112-4 (1989).
Bernardini, et al., "Spontaneous polarization and piezoelectric constants of III-V nitrides", Phys. Rev. B., 56(16):RI0024-7 (1997).

(56) References Cited

OTHER PUBLICATIONS

Bour, et al., "Design and performance of asymmetric waveguide nitride laser diodes", IEEE J Quantum Electron, 36(2):184-191 (2000).

Caliman, et al., "8 mW fundamental mode output of wafer-fused VCSELs emitting in the 1550-nm band", Optics express, 19(18):16996-17001 (2011).

Chang, et al., "Strain Balanced AlGaN/GaN/AlGaN nanomembrane HEMTs", Sci. Rep., 7:6360 (2017).

Chen, et al., "High reflectance membrane-based distributed Bragg reflectors for GaN photonics", Appl. Phys. Lett., 101:221104 (2012a).

Chen, et al., "Nanopores in GaN by electrochemical anodization in hydrofluoric acid: Formation and mechanism", J. Appl. Phys., 112:064303 (2012b).

Choquette, et al., "Selective Oxidation of Buried AlGaAs for Fabrication of Vertical-Cavity Lasers", Conference: Spring meeting of the Materials Research Society (MRS), San Francisco, CA, 1-10 (1996).

Dorsaz, et al., "Selective oxidation of AlInN layers for current confinement in III-nitride devices", Appl Phys Lett., 87:072102 (2005).

Extended European Search Report for European Application No. 11737629.3, dated Oct. 12, 2017.

Extended European Search Report for European Application No. 15846362.0, dated Apr. 24, 2018.

Extended European Search Report for European Application No. 16797298.3, dated Dec. 3, 2018.

Gautier, et al., "Observations of Macroporous Gallium Nitride Electrochemically Etched from High Doped Single Crystal Wafers in HF Based Electrolytes", ECS J. of Solid State Science and Technology, 2(4): p. 146-p. 148 (2013).

Han, et al., "Single-Crystalline, Nanoporous Gallium Nitride Films With Fine Tuning of Pore Size for Stem Cell Engineering", J. Nanotechnol. Eng. Med., 5:0410041-0410049 (2014).

Higuchi, et al., "Room-Temperature CW Lasing of a GaN-Based Vertical-Cavity Surface-Emitting Laser by Current Injection", Appl. Phys. Express., 1(12):121102 (2008).

Holder, et al., "Demonstration of nonpolar GaN-based vertical-cavity surface-emitting lasers", Proc SPIE., 8639:863906 (2013).

International Preliminary Report on Patentability for International Application No. PCT/US2013/046852, mailed Jan. 8, 2015.

International Preliminary Report on Patentability for International Application No. PCT/US2015/053254, mailed Apr. 13, 2017.

International Preliminary Report on Patentability for International Application No. PCT/US2016/033270, mailed Nov. 30, 2017.

International Preliminary Report on Patentability, mailed Aug. 9, 2012 for Application No. PCT/ US2011/022701.

International Search Report and Written Opinion for International Application No. PCT/US2011/022701, mailed Apr. 8, 2011.

International Search Report and Written Opinion for International Application No. PCT/US2013/046852, mailed Oct. 29, 2013.

International Search Report and Written Opinion for International Application No. PCT/US2015/053254, mailed Dec. 29, 2015.

International Search Report and Written Opinion for International Application No. PCT/US2016/033270, mailed Aug. 25, 2016.

International Search Report for PCT application PCT/US2020/061792 dated Jul. 12, 2021.

International Search Report for PCT application PCT/US2020/061794 dated Feb. 10, 2021.

International Search Report for PCT application PCT/US2022/027391 dated Aug. 16, 2022.

Jiang, et al., "Semiconductor lasers: Expanding into blue and green", Nat. Photon. 5:521-2 (2011).

Kasahara, et al., "Demonstration of Blue and Green GaN-Based Vertical-Cavity Surface-Emitting Lasers by Current Injection at Room Temperature", Appl. Phys. Express., 4(7):072103 (2011).

Kiefer, et al., "Si/Ge junctions formed by nano membrane bonding", ACS Nano, 5(2):1179-89 (2011).

Kim, et al., "Reactivation of Mg acceptor in Mg-doped GaN by nitrogen plasma treatment", Appl. Phys. Lett., 76(21):3079-81 (2000).

Krishnamoorthy, et al., "InGaN/GaN tunnel junctions for hole injection in GaN light emitting diodes", Appl. Phys. Lett., 105(14):141104 (2014).

Kucheyev, et al., "Ion-Beam-Induced Porosity of Gan", Applied Physics Letters, 77(10): 1455-1457 (2000).

Kurokawa, et al., "Multijunction GaInN-based solar cells using a tunnel junction", Appl. Phys. Express., 7(034104):1-4 (2014).

Laino, et al., "Substrate Modes of (Al, In)GaN Semiconductor Laser Diodes on SiC and GaN Substrates", IEEE J Quantum Electron, 43(1):16-24 (2007).

Lee, et al., "Enhanced performance of InGaN/GaN multiple-quantum-well light-emitting diodes grown on nanoporous GaN layers", Opt. Express, 22 Suppl 4:A1164-1173 (2014).

Lee, et al., "Optically pumped GaN vertical cavity surface emitting laser with high index-contrast nanoporous distributed Bragg reflector", Opt. Express, 23:11023-11030 (2015).

Lin, et al., "Current steering effect of GaN nanoporous structure", Thin Solid Films, 570(Part B):293-7 (2014).

Lu, et al., CW lasing of current injection blue GaN-based vertical cavity surface emitting laser, Appl. Phys. Lett., 92:141102 (2008).

Minsky, et al., "Room_temperature photoenhanced wet etching of GaN", Appl. Phys. Lett., 68:1531-1533 (1996).

Mishkat-Ul-Masabih, et al., "Electrically injected nonpolar GaN-based VCSELs with lattice-matched nanoporous distributed Bragg reflector mirrors", Applied Physics Express, 12(3): 036504 (2019).

Pandey, et al., "Formation of self-organized nanoporous anodic oxide from metallic gallium", Langmuir, 28(38): 13705-11 (2012).

Park, et al., "Doping selective lateral electrochemical etching of GaN for chemical lift-off", Applied Physics Letters, 94(22):221907-1-221907-3 (2009).

Park, et al., "High Diffuse Reflectivity of Nanoporous GaN Distributed Bragg Reflector Formed by Electrochemical Etching", Applied Physics Express, 6(7):072201-1-4 (2013).

Park, et al., "Wide Bandgap III-Nitride Nanomembranes for Optoelectronic Applications", Nano Lett., 14:4293-4298 (2014).

Piprek, "Blue light emitting diode exceeding 100% quantum efficiency", Phys. Status Solidi RRL, 8(5):424-6 (2014).

Pourhashemi, et al., "High-power blue laser diodes with indium tin oxide cladding on Semipolar GaN substrates", Appl. Phys. Lett., 106:111105 (2015).

Quill, et al., "Effect of Current Density on Pore Formation in n-InP in KOH", ECS transactions, 58(8):25-38 (2013).

Rogers, et al., "Synthesis, assembly and applications of semiconductor nanomembranes", Nature, 477(7362):45-53 (2011).

Ruoyuan, et al., "Wet oxidation of AlGaAs/GaAs distributed Bragg reflectors", Chin. J. Semiconductors, 26(8):1519-23 (2005).

Ryu, et al., "Improved photoelectrochemical water splitting efficiency of nanoporous GaN photoanode", Semicond. Sci. Technol., 27(1):015014 (2012).

Schubert, et al., "Optical properties of Si-doped GaN", Appl. Phys. Lett., 71:921-923 (1997).

Schwab, et al., "Aligned Mesopore Arrays in GaN by Anodic Etching and Photoelectrochemical Surface Etching", J. Phys. Chem. C., 117:16890-16895 (2013).

Someya, et al., "Room temperature lasing at blue wavelengths in gallium nitride microcavities", Science, 285(5435):1905-6 (1999).

Stonas, et al., "Development of selective lateral photoelectrochemical etching of InGaN/GaN for lift-off applications", Appl. Phys. Lett., 78:1945-1947 (2001).

Sundararajan, et al., "Gallium nitride: Method of defect characterization by wet oxidation in an oxalic acid electrolytic cell", J. Vac. Sci. Tech. B., 20(4): 1339-41 (2002).

Todt, et al., "Oxidation kinetics and microstructure of wet-oxidized MEE-grown short-period AlGaAs superlattices", Mat. Res. Soc. Symp. Proc., 692:561-6 (2002).

Vajpeyi, et al., "High Optical Quality Nanoporous GaN Prepared by Photoelectrochemical Etching", Electrochemical and Solid-State Letters, 8(4):G85-8 (2005).

(56) References Cited

OTHER PUBLICATIONS

Waldrip, et al., "Stress engineering during metalorganic chemical vapor deposition of AlGaN/GaN distributed Bragg Reflectors", Appl. Phys. Lett., 78:3205 (2001).

Xiong, et al., "Single Crystal Gallium Nitride Nanomembrane Photoconductor and Field Effect Transistor", Adv. Funct. Mater., 24:6503-6508 (2014).

Yam, et al., "Porous GaN prepared by UV assisted electrochemical etching", Thin Solid Films, 515(7-8):3469-3474 (2007).

Yam, et al., "Structural and optical characteristics of porous GaN generated by electroless chemical etching", Mater. Lett., 63:724-7 (2008).

Yerino, et al., "Shape transformation of nanoporous GaN by annealing: From buried cavities to nanomembranes", Appl Phys Lett., 98(25):251910 (2011).

Youtsey, et al., "Broad-area photoelectrochemical etching of GaN ", Electron. Lett., 33:245-246 (1997b).

Youtsey, et al., "Highly anisotropic photoenhanced wet etching of n-type GaN", Appl. Phys. Lett., 71(15):2151-2153 (1997a).

Yuan, et al., "Optical Engineering of Modal Gain in a III-Nitride Laser with Nanoporous GaN", ACS Photonics, 3:1604-1610 (2016).

Zhang, et al., "Mesoporous GaN for Photonic Engineering-Highly Reflective GaN Mirrors as an Example", ACS Photonics, 2(7):980-986 (2015).

Zhang, et al., "A conductivity-based selective etching for next generation GaN devices", Physica Status Solidi B., 247(7):1713-6 (2010).

Zhang, et al., "A resonant-cavity blue-violet light-emitting diode with conductive nanoporous distributed Bragg reflector", Phys. Status Solidi A, 214:1600866 (2017).

Zhang, et al., "Supporting Information Mesoporous GaN for Photonic Engineering—Highly Reflective GaN Mirrors as an Example", Jun. 30, 2015 (Jun. 30, 2015), XP055818875, Retrieved from the Internet: URL:https://pubs.acs.org/doi/abs/10.1021/acsphotonics.5b00216 [retrieved on Jun. 28, 2021].

Zhang, et al., "Toward Quantitative Electrochemical Nanomachining of III-Nitrides", J. Electrochem. Soc., 165:E513-E520 (2018).

Zheng, et al., "Synthesis of Ultra-Long and Highly Oriented Silicon Oxide Nanowires from Liquid Alloys", Adv. Mater., 14(2):122-4 (2002).

Zhou, et al., "Near ultraviolet optically pumped vertical cavity laser", Electron Lett., 36: 1777-9 (2000).

Spiridon, et al., "On-Chip Thermal Insulation Using Porous GaN", Proceedings, Vo. 2, No. 13:776, 2018, 5 pages.

* cited by examiner $$d_w : d_{sc} > 2$$

$$d_w : d_{sc} < 1$$

Abrupt interface

Graded doping in 50 nm

POROUS III-NITRIDES AND METHODS OF USING AND MAKING THEREOF

CROSS-REFERENCE TO RELATED APPLICATION

This application is a National Phase application under 35 U.S.C. 371 of PCT/US2020/058295, filed Oct. 30, 2020, which claims the benefit of and priority to U.S. Ser. No. 62/928,882 filed Oct. 31, 2019 and which are incorporated by reference herein in their entirety.

FIELD OF THE INVENTION

This invention is in the field of III-nitrides, such as GaN, and their alloys which have controlled porosities and can be used in electronic applications, such as photonic devices.

BACKGROUND OF THE INVENTION

Single crystalline III-nitrides, such as GaN, are known for their chemical inertness, and can be etched by wet chemistry techniques. Such wet etching of III-nitrides, however, can only be done through photoelectrochemical (PEC) etching methods (Minsky, et al. Appl. Phys. Lett. 68, 1531-1533 (1996); Youtsey, et al. MRS Online Proc. Libr. Arch. 468, (1997); Youtsey, et al. Electron. Lett. 33, 245-246 (1997); Stonas, et al. Appl. Phys. Lett. 78, 1945-1947 (2001)). The mechanism of PEC methods rely, however, on the generation of holes ($h^+$) through photo-excitation and subsequent oxidation-etching of a III-nitride, such as GaN. As an example, the PEC procedure has been used in selective etching techniques with a combination of epitaxial heterostructures (InGaN/GaN) and bandgap selective photo-excitation. An InGaN sacrificial layer is often used in PEC etching for liftoff of such GaN films. Nevertheless, such PEC techniques have limited usage as it imposes constraints on the composition of the group III-nitride species and bandgap of the material to be etched. In the porous etching regime, it also lacks controllability in the pore morphology (Al-Heuseen, et al. Appl. Surf. Sci. 257, 6197-6201 (2011)).

Therefore, there is a need for porous III-nitrides with controlled/tuned properties.

There also is a need for improved methods of making such porous III-nitrides which allow for controllability and tunability of the properties of the porous III-nitrides.

Therefore, it is an object of the invention to provide such porous III-nitrides having controlled/tuned properties.

It is yet another object of the invention to provide methods for preparing such porous III-nitrides.

It is still a further object of the invention to provide methods of using the described porous III-nitrides.

SUMMARY OF THE INVENTION

Porous wide bandgap III-nitrides with tunable optical, electrical, and thermal properties are described herein. Wide bandgap III-nitrides include aluminum nitrides, gallium nitrides, indium nitrides, and alloys thereof. In some embodiments, the wide bandgap III-nitride is a gallium nitride (GaN) which is controllably porosified according to the electrochemical etching methods described below.

One or more layers of III-nitrides, such as GaN, can be grown epitaxially or homoepitaxially according to art known methods. Porosification of a layer or layers of III-nitrides requires that the bulk epitaxial layer(s) be doped with an n-type dopant. The doping concentration can be uniform across the entirety of a III-nitride layer or the doping concentration may form a gradient (i.e., a III-nitride layer having a graded dopant concentration across an axis of the layer, such width). Porosification by electrochemical (EC) etching is generally limited to III-nitrides which are doped at moderate to high concentrations and low doping concentrations are not porosified under the EC etching conditions.

In some instances, interfacing layers of III-nitrides may each have different doping concentrations from one another and the interfaces between the layers are characterized by sharp/abrupt difference in their doping concentrations. In some cases, the layers may alternate between doped and undoped III-nitrides.

The porosified III-nitrides can have porosities in the range of between about 10% and 90% or 20% and 80%. In some instances, the porosity is at least about 10%, 20%, 30%, 40%, 50%, 60%, 70%, 80%, or 90%. The porosity of a given III-nitride layer following electrochemical (EC) etching is typically uniform across the given porosified layer, but may also be non-uniform. In some instances, a single layer of III-nitride can have a gradient porosity across a defined thickness within the layer, where the porosity changes across the thickness from between about 10% and 90% or 20% and 80%.

The porosified III-nitrides described may form interfaces with other III-nitrides (porous or non-porous (bulk) nitrides). In such cases multilayer structures contain a combination of layers of porosified III-nitrides and layers bulk (non-porous) III-nitrides.

The dimensions of one or more layers of porosified III-nitride and/or of a bulk (non-porous) layer of III-nitride can be of any size or shape suitable for an application. In the cases of multilayer structures containing both porous and bulk III-nitride layers, the layers contained therein can have the same size, shape, and area.

Incorporation of a low index material, such as air, into a porosified III-nitride layer(s) can be used to tune the optical, electrical, and/or thermal properties, as described below in detail.

In one non-limiting method, porous III-nitride layer or layers are formed by the steps of:

(a) providing or depositing one or more layers of a III-nitride, such as aluminum nitrides, gallium nitrides, indium nitrides, and alloys thereof; wherein at least one of the layers of a III-nitride is doped with an n-type dopant; and (b) electrochemically (EC) etching the at least one of the layers of III-nitride which is doped with an n-type dopant in the presence of an electrolyte and under an applied bias voltage to form a plurality of pores therein. Porosification of a layer or layers of III-nitrides requires that the bulk III-nitride layer(s) be doped with an n-type dopant. The one or more layer(s) may be doped during deposition/formation of the III-nitride layer(s). The doping concentration can be uniform across the entirety of a III-nitride layer or the doping concentration may form a gradient (i.e., a III-nitride layer having a graded dopant concentration across an axis of the layer, such width).

The porosification of the doped III-nitride layer(s) proceeds by an electrochemical (EC) etching process of step (b). Different porosities and pore morphologies may be obtained by changing the type and concentration of electrolyte, doping concentration, and applied bias voltage (as discussed below). The applied bias voltage is typically a positive voltage in the range of between about 0.1 to 10 V, 1.0 to 5V, or 1.0 to 2.5V. The electrochemical porosification is conducted in the electrolyte where the III-nitride layer(s) acts as the anode (under a positive bias) in the presence of a cathode (under negative bias), such as a platinum wire. The electric field direction during the EC etching process can control the direction of the etching direction and thereby control the direction of the pores etched into the bulk doped III-nitride layer. In some instances, vertical etching produces columnar pores which are vertically aligned, while in some other instances lateral etching produces columnar pores which are laterally aligned.

Through the controlled EC etching methods discussed herein, doped III-nitride layers can be formed into porosified III-nitride layers which can have porosities therein in the range of between about 10% and 90% or 20% and 80%. In some instances, the porosity is at least about 10%, 20%, 30%, 40%, 50%, 60%, 70%, 80%, or 90%. In some instances, the porosities change in a graded manner across a thickness within a given layer of porosified III-nitride, based on the doping gradient formed therein. Thus, the porosity of a given III-nitride layer following electrochemical (EC) etching is typically uniform across the given porosified layer, but may also be non-uniform.

The porous III-nitrides, such as porous GaN, and multi-layer structures containing porous III-nitrides (i.e., having alternating layers of porous GaN/bulk (non-porous) GaN) and fabricated according to the electrochemical (EC) etching processes/methods described can be used in electronic, photonic, and optoelectronic applications. These can include, but are not limited to, light-emitting diodes (such as, resonant-cavity LEDs (RC-LEDs)), field-effect transistors, laser diodes (vertical-cavity surface-emitting lasers (VC-SELs)), bio-platforms, and water splitting. The porous III-nitrides, such as porous GaN, and multilayer structures containing such porous III-nitrides can be prepared according to the methods and these can be incorporated into different devices using art known techniques.

DETAILED DESCRIPTION OF THE INVENTION

I. Definitions

Figure 1A:
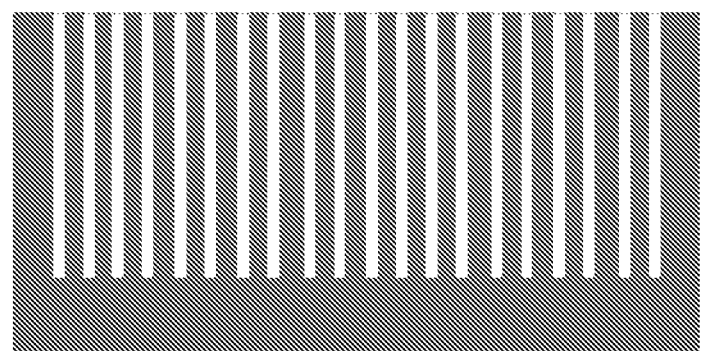
FIG. 1A is a non-limiting representation of a porous GaN with vertically aligned pores.

"Porosity," as used herein refers to the volumetric ratio of air present in a porosified medium, such as III-nitride layer(s), which is expressed as a percentage.

"Refractive Index" or "Index of Refraction," are used interchangeably and refer to the ratio of the velocity of light in a vacuum to its velocity in a specified medium, such as a layer of a III-nitride, according to the formula n=c/v, where c is the speed of light in vacuum and v is the phase velocity of light in the medium.

"Refractive Index Contrast," as used herein refers to the relative difference in refractive index between two mediums having different indices of refraction and which are in contact and form an interface.

"Bulk III-nitride," as used herein refers to an unetched pristine III-nitride.

Numerical ranges disclosed in the present application include, but are not limited to, ranges of temperatures, ranges of times, ranges of bias voltages, ranges of porosities, ranges of thermal conductivities, ranges of integers, and ranges of thicknesses, amongst others. The ranges disclose individually each possible number that the range could reasonably encompass, as well as any sub-ranges and combinations of sub-ranges encompassed therein. For example, disclosure of a time range is intended to disclose individually every possible time value that such a range could encompass, consistent with the disclosure herein.

Use of the term "about" is intended to describe values either above or below the stated value, which the term "about" modifies, in a range of approx. +/−10%; in other instances the values may range in value either above or below the stated value in a range of approx. +/−5%. When the term "about" is used before a range of numbers (i.e., about 1-5) or before a series of numbers (i.e., about 1, 2, 3, 4, etc.) it is intended to modify both ends of the range of numbers and/or each of the numbers recited in the entire series, unless specified otherwise.

II. Porous III-Nitrides and Alloys Thereof

Porous wide bandgap III-nitrides with tunable optical, electrical, and thermal properties are described herein. Wide bandgap III-nitrides include aluminum nitrides, gallium nitrides, indium nitrides, and alloys thereof. In certain instances, the wide bandgap III-nitride is a gallium nitride (GaN) which is controllably porosified according to the electrochemical etching methods described below.

One or more layers of III-nitrides, such as GaN, can be grown epitaxially or homoepitaxially according to art known methods. In some instances, the III-nitride layer can be grown, for example, on a suitable substrate (i.e., c-plane of sapphire) by metal organic chemical vapor deposition (MOCVD). A layer of a porosified III-nitride may have a thickness in a range of between about 10 to 10,000 nm, 10 to 1000 nm, or 10 to 500 nm. In some instances, the porosified III-nitride has a thickness which is uniform across the layer. In some other instances, the thickness may be non-uniform across a porosified III-nitride layer.

Porosification of a layer or layers of III-nitrides requires that the bulk epitaxial layer(s) be doped with an n-type dopant. Exemplary dopants include, but are not limited to, n-type Ge and Si dopants. Such dopant sources can include, for example, silane ($SiH_4$), germane ($GeH_4$), and isobutylgermane (IBGe) which can be doped into layer(s) of III-nitrides during their formation/deposition. It is preferred that the III-nitrides which are porosified are aluminum free or substantially free of aluminum (where "substantially free" means less than about 5%, 4%, 3%, 2%, 1%, 0.9%, 0.8%, 0.7%, 0.6%, 0.5%, 0.4%, 0.3%, 0.2%, or 0.1% aluminum by weight in the doped III-nitride layer). The doping concentration can be uniform across the entirety of a III-nitride layer or the doping concentration may form a gradient (i.e., a III-nitride layer having a graded dopant concentration across an axis of the layer, such width). The doping concentration is considered high at doping concentration levels of at least about $1\times10^{20}$ cm$^{-3}$ or higher; or in the range of between about $0.5\times10^{20}$ cm$^{-3}$ to $10\times10^{20}$ cm$^{-3}$. The doping concentration is considered to be moderate at doping concentration levels of greater than about $1\times10^{18}$ cm$^{-3}$ to less than $1\times10^{20}$ cm$^{-3}$, $2\times10^{18}$ cm$^{-3}$ to less than $1\times10^{20}$ cm$^{-3}$, $3\times10^{18}$ cm$^{-3}$ to less than $1\times10^{20}$ cm$^{-3}$, $4\times10^{18}$ cm$^{-3}$ to less than $1\times10^{20}$ cm$^{-3}$, or $5\times10^{18}$ cm$^{-3}$ to less than $1\times10^{20}$ cm$^{-3}$. In some instances, the moderately doped concentration level is in the range of $1\times10^{19}$ cm$^{-3}$ to less than $1\times10^{20}$ cm$^{-3}$ or in the range of about $0.5\times10^{19}$ cm$^{-3}$ to $10\times10^{19}$ cm$^{-3}$. The doping concentration is considered to be low at doping concentration levels of less than about $1\times10^{18}$ cm$^{-3}$ or in the range of between about $0.5\times10^{18}$ cm$^{-3}$ to $10\times10^{18}$ cm$^{-3}$. Porosification by electrochemical (EC) etching is generally limited to III-nitrides which are doped at moderate to high concentrations and low doping concentrations are not porosified under the EC etching conditions. The concentration of the n-type dopant changes across the width of a III-nitride layer may vary as a gradient function over a defined thickness within the layer, where the n-type dopant concentration changes linearly or non-linearly within a range of between about $5\times10^{18}$ cm$^{-3}$ to $1\times10^{20}$ cm$^{-3}$. The defined thickness within the layer can be about 5, 10, 15, 20, 25, 30, 35, 40, 45, 50, 55, 60, 65, 70, 75, 80, 85, 90, 95, 100, 200, 300, 400, 500 nm within the layer. On EC etching, porosification is limited to the doping concentrations within the width of the layer which are moderate to high in doping. In some instances, where there is no porosity or substantially no porosity (i.e., less 5%, 4%, 3%, 2%, 1%, or less) introduced by EC etching outside of the thickness of the layer that is not doped or having a low doping concentration. This can produce a single layer of III-nitride having a gradient porosity across the defined thickness where the porosity also changes across the thickness and can range from between about 10% and 90% or 20% and 80%.

In some instances, interfacing layers of III-nitrides may each have different doping concentrations from one another and the interfaces between the layers are characterized by a sharp/abrupt difference in doping concentrations. Sharp/ abrupt differences generally refer to differences in doping concentration from no doping or low doping to moderate or high doping concentration, where the change occurs across a thickness of less than 100, 90, 80, 70, 60, 50, 40, 30, 20, 10 nm, or less. In some cases, the layers may alternate between doped and undoped III-nitrides. For example, the layers may include doped GaN/undoped GaN in alternating pairs, where multiple alternating pairs of doped GaN/undoped GaN repeat. In some other instances, to prevent such abrupt/sharp changes in the doping concentrations between layers, the doping profile/gradient can be controlled across the width (i.e., thickness) of doped layer or layers, such that the concentration changes in a gradient fashion from a low to a high concentration, a low to a moderate concentration, a moderate to a high concentration, or a low to a moderate to a high concentration across the width (i.e., thickness) of the one or more doped layer or layers. The change in the gradient is typically a linear change by controlling the dopant source flow over a period of time during the deposition of the III-nitride layer. The doping gradient (or graded layer) can be tuned over a thickness of between about 5 to 100 nm, 5 to 75 nm, 5 to 50 nm, or 5 to 25 nm with dopant concentration linearly changing from $5 \times 10^{18}$ cm$^{-3}$ to $1 \times 10^{20}$ cm$^{-3}$. In some cases the doping gradient (or graded layer) thickness is about 5, 10, 15, 20, 25, 30, 35, 40, 45, 50, 55, 60, 65, 70, 75, 80, 85, 90, 95, 100 nm thick with dopant concentration linearly changing from $5 \times 10^{18}$ cm$^{-3}$ to $1 \times 10^{20}$ cm$^{-3}$. The electrochemical (EC) etching methods described below are used to controllably porosity the doped bulk III-nitride layers based on the doping concentration and the applied bias voltage.

The porosified III-nitrides can have porosities in the range of between about 10% and 90% or 20% and 80%. In some instances, the porosity is at least about 10%, 20%, 30%, 40%, 50%, 60%, 70%, 80%, or 90%. The porosity of a given III-nitride layer, following electrochemical (EC) etching, is typically uniform across the given porosified layer, but may also be non-uniform. To measure porosity a doped III-nitride can be weighed, such as on a micro-balance, before and after porosification and the weight difference (loss) in the EC etched porosified over the original (before) weight can be expressed as a percentage to denote the degree of porosity. In some other instances, porosity may also be measured/estimated by imaging processing software, such as ImageJ, where scanning electron microscopy (SEM) images of the porosified III-nitride is used. There is very good agreement on the porosities calculated by the weighing (micro-balance) and image processing methods.

Figure 1B:
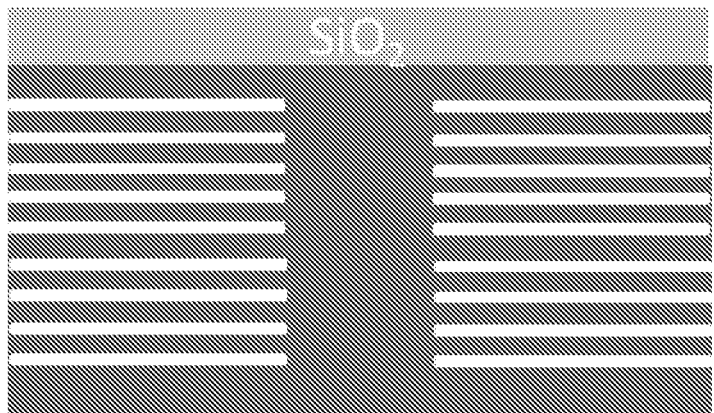
FIG. 1B is a non-limiting representation of a porous GaN with laterally aligned pores and an optional silicon dioxide current spreading layer.

The porosification of the doped III-nitride layer(s) proceeds by an electrochemical (EC) etching process. Different porosities and pore morphologies may be obtained by changing the type and concentration of electrolyte (either salt or acid), doping concentration, and applied bias voltage (as discussed in detail below). The electric field direction during the EC etching process can control the direction of the etching direction and thereby control the direction of the pores etched into the bulk doped III-nitride layer. In some instances, vertical etching produces columnar pores which are vertically aligned relative to the growth surface (FIG. 1A). In some other instances, lateral etching produces columnar pores which are laterally aligned relative to the growth surface (see FIG. 1B).

In some cases, a current spreading layer may be optionally deposited onto the doped III-nitride layer(s), where the current spreading layer is n-type doped and ensures uniform current distribution during the EC etching process.

The porosification of the doped III-nitride(s) produces nanoporous III-nitride(s). The columnar vertically or laterally aligned pores formed in the III-nitride(s) during the EC etching process can have average lengths of about 5 to 1000 nm, 5 s to 900 nm, 10 to 800 nm, 10 to 700 nm, 10 to 600 nm, 10 to 500 nm, 10 to 400 nm, 10 to 300 nm, 10 to 200 nm, 10 to 100 nm, or 10 to 50 nm. In some cases, the average length is about 100 nm, 90 nm, 80 nm, 70 nm, 60 nm, 50 nm, 40 nm, 30 nm, 20 nm, or 10 nm. The vertically or laterally aligned pores may be further categorized as microporous (d<2 nm), mesoporous (2 nm<d<50 nm), or macroporous (d>50 nm); where d is the average pore diameter. The morphology of the formed pores may be classified as circular, semicircular, ellipsoidal, or a combination thereof. The pores may have an average size of between about 5 to 100 nm, 5 to 75 nm, 5 to 50 nm, or 5 to 25 nm. In some instances the average pore size is about 5, 10, 20, 30, 40, 50, 60, 70, 80, 90, 100 nm or greater. The spacing between adjacent pores (which is also defines a measure of wall thickness of the pores) increases as a function of a lower applied bias and a lower doping concentration. The spacing between pores can range from between about 1 to 50 nm, 5 to 50 nm, 5 to 40 nm, 5 to 30 nm, 5 to 25 nm, 5 to 20 nm, 5 to 15 nm, or 5 to 10 nm.

Figure 3A:
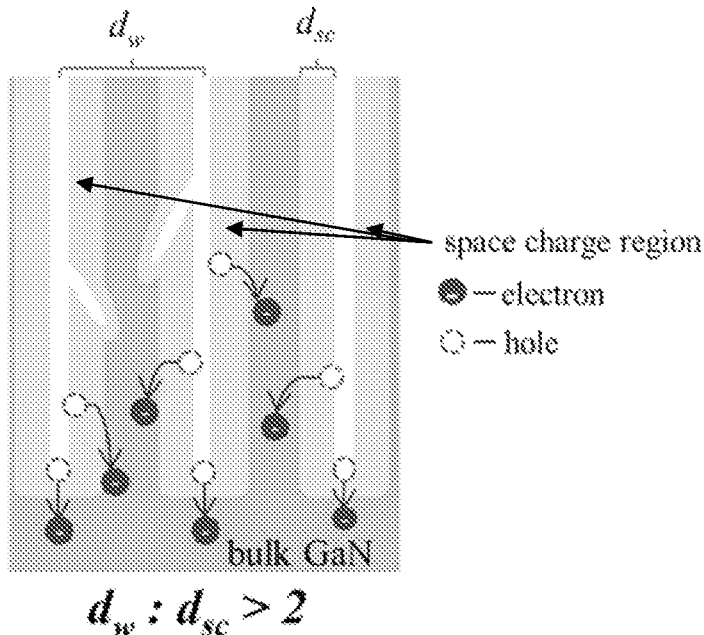
FIG. 3A is a non-limiting schematic representation of possible pore morphologies based on the ratio of space charge region thickness and pore separation being greater than 2.
Figure 3B:
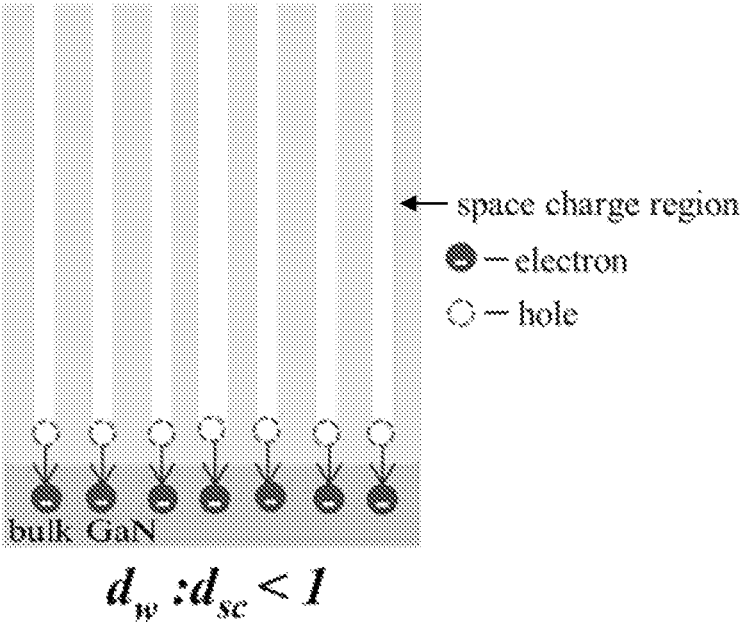
FIG. 3B is a non-limiting schematic representation of possible pore morphologies based on the ratio of space charge region thickness and pore separation being less than 1.

The columnar vertically or laterally aligned pores are typically found in a parallel arrangement due to the pore growth mechanisms operating during EC etching. In additional to parallel pore propagation, branching and bifurcation of pores may also result (FIG. 3A). Accordingly, in certain instances the columnar vertically or laterally aligned pores may be interconnected between pores.

The porosified III-nitrides may form interfaces with other III-nitrides (porous or non-porous (bulk) nitrides). In such cases multilayer structures contain a combination of layers of porosified III-nitrides and layers bulk (non-porous) III-nitrides. To prepare these types of structures it is possible to prepare, for example, layers of III-nitrides wherein at least one of the layers is sufficiently doped with a dopant that applying an electrochemical etching process porosified, selectively, those layers which are sufficiently doped. Prior to porosification, these multilayer structures may be alternating formed of pairs of layers of doped III-nitride and undoped III-nitride layers. Following porosification by EC etching, these multilayer structures alternating pairs result in porosified III-nitride and non-porous (bulk) III-nitride layers. In certain cases, the non-porous (bulk) III-nitride layers may be doped with a dopant at a concentration range, such as with the dopants and at the concentration ranges described above. It is preferred for the alternating pairs of porosified III-nitride and non-porous (bulk) III-nitride layers to be formed of the same III-nitride in order to have the same lattice constant. In still other cases multilayer structures contain layers of porosified III-nitride and the layers each have different degrees of porosities from each other. The thickness of the doped III-nitride layer, prior to or following porosification, can be of any thickness disclosed above. The thickness of a non-porous (bulk) layer of III-nitride can range in between about 10 to 10,000 nm, 10 to 1000 nm, or 10 to 500 nm. In some instances, the thicknesses of the individual layers in a multilayer structure (stack) forming, for example, a DBR will be on the order of about 5 to 50 nm.

The dimensions of one or more layers of porosified III-nitride and/or of a bulk (non-porous) layer of III-nitride can be of any size or shape suitable for an application. The area of a layer of porous III-nitride and/or of a bulk (non-porous) layer of III-nitride can be any suitable area. In some instances, the area is in the range of between about 0.1 to 100 cm², 0.1 to 90 cm², 0.1 to 80 cm², 0.1 to 70 cm², 0.1 to 60 cm², 0.1 to 50 cm², 0.1 to 40 cm², 0.1 to 30 cm², 0.1 to 20 cm², 0.1 to 10 cm², 0.1 to 5 cm², or 0.1 to 1 cm². In the cases of multilayer structures containing both porous and bulk III-nitride layers the layers contained therein typically have the same size, shape, and area.

a. Optical Properties of Porous III-Nitrides

Incorporation of a low index material, such as air, into a porosified III-nitride has the effect of lowering the refractive index of the bulk III-nitride. By varying the volumetric ratio of air (or porosity), porous III-nitrides demonstrate tunability in their refractive index. The refractive index (n) of a porosified or porous III-nitride disclosed herein is in the range of between about 1 and 2.6 dependent on the degree of porosity (i.e., amount of air in the porous III-nitride), where the refractive index of air is about 1 (at STP) and the refractive index of a bulk (non-porous) III-nitride is about 2.6. In some cases, the porous III-nitride has a refractive index of about 1.1, 1.2, 1.3, 1.4, 1.5, 1.6, 1.7, 1.8, 1.9, 2, 2.1, 2.2, 2.3, 2.4, or 2.5. In certain instances, the refractive index of a porous III-nitride, such as a porous GaN, is about 2.2 when the porosity is about 20%, about 1.9 when the porosity is about 40%, about 1.6 when the porosity is about 60%, or about 1.3 when the porosity is about 80%.

In multilayer structures containing a combination of layers of porosified III-nitrides and layers bulk (non-porous) III-nitrides, such as alternating pairs. The porosified III-nitrides described form interfaces with other III-nitrides (porous or non-porous (bulk) nitrides) which have a different index of refraction than the index of refraction of the porosified III-nitride. This difference represents the refractive index contrast ($\Delta n$). It is preferred that the refractive index contrast between porosified III-nitride layer(s) and other III-nitrides is high and that $\Delta n$ is greater than 0.4 and more preferably greater than 0.5. In some instances, $\Delta n$ between porosified III-nitride layer(s) and other III-nitrides is at least about 0.5, 0.6, 0.7, or 0.8.

Figure 15A:
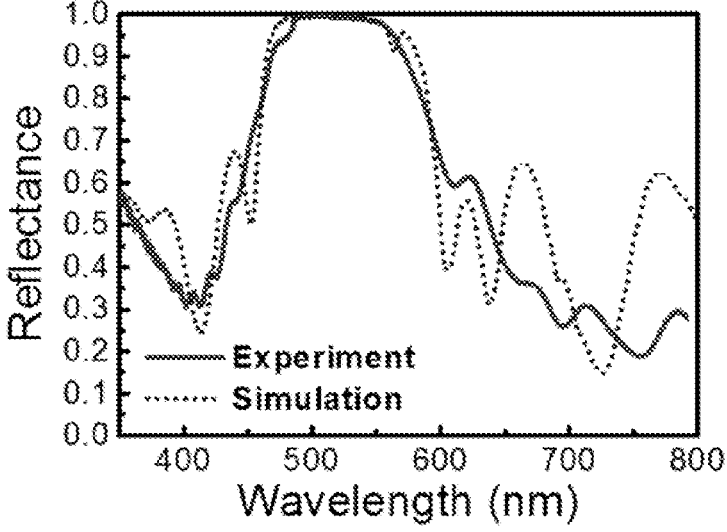
FIG. 15A is a graph of the experimentally measured (solid line) and COMSOL simulated (dashed line) reflectance spectra from a DBR region with a peak reflectance exceeding 99.5%.
Figure 15B:
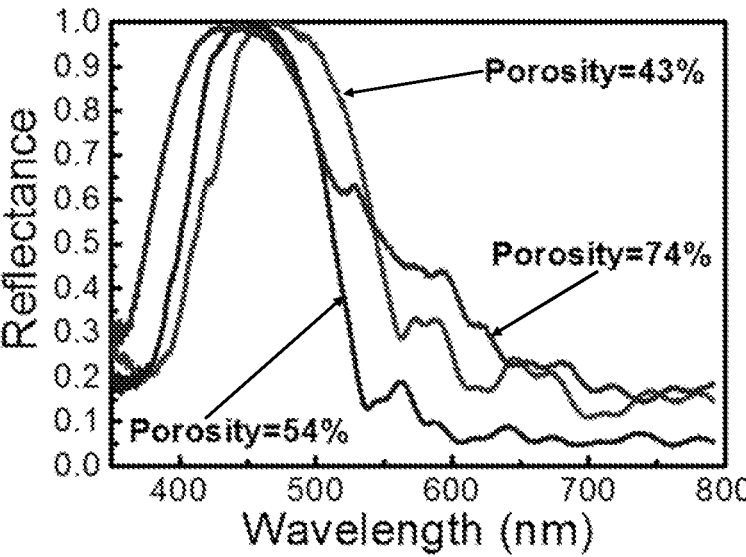
FIG. 15B is a graph of the reflectance from three porous-GaN DBRs in the blue wavelengths with tuned porosities of 43%, 54%, and 74%.
Figure 16:
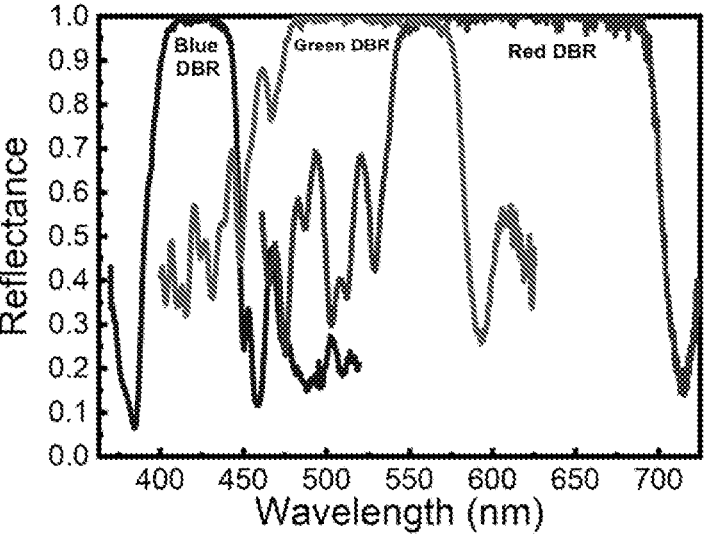
FIG. 16 is a graph of the reflectance from three porous-GaN DBRs in the blue, green, and red wavelength regions.

Varying the porosity of III-nitrides, such as GaN, between about 40 to 75% causes detuning by changing the refractive index and the Bragg condition. The peak wavelength of the stopband could therefore be varied by up to 30 nm for an exemplary blue GaN/porous-GaN DBR (FIG. 15B). Highly reflective (>99.5%) DBR mirrors can be made containing the porosified III-nitrides described in the blue (440 nm), green (520 nm), and red (600 nm) wavelength ranges (FIG. 16). The porosified III-nitrides described also exhibit negligible amounts of scattering.

b. Electrical Properties of Porous III-Nitrides

Varying the volumetric ratio of air (or porosity) of the porous III-nitride, such as GaN, can affect the electrical properties of the porous III-nitride as compared to the bulk (non-porous) equivalent III-nitride. For electrically injected devices, especially those requiring high current densities, good electrical transport is essential for high device performance. The resistivity of single layer porous III-nitride(s) can be measured through a Hall measurement and it was confirmed that the porous III-nitrides, such as porous GaN, remained highly conductive.

In some instances, the porosification of III-nitride, results in about an order of magnitude decrease in the electron concentration after the EC etching process has occurred. For example, in a doped III-nitride prior to porosification which was doped above $1 \times 10^{20}$ cm⁻³, the resulting porous III-nitride layer(s) having porosities therein of at least about 5%, 10%, 20%, 30%, 40%, 50%, or 60% can maintain a carrier (electron) concentration of above about $5 \times 10^{18}$ cm⁻³ and electrical mobilities of at least about 50, 60, 70, 80, 90, 95 cm²/V s, or greater.

In certain instances, such as when multilayer structures comprise porous and non-porous interfacing III-nitride layers(s), such as in a distributed Bragg reflector (DBR) structure, the electrical conductance through III-nitride/porous-III-nitride DBR stack can exhibit a nonlinear Schottky-like behavior. The nonlinear I-V is believed to be due to the existence of interfacial depletion layers related to the nanoscale porous geometry. By tailoring the pore morphology through designed doping profiles/gradients, as discussed above, and EC etching conditions, as discussed below, sufficient current pathways can be created/maintained through porous III-nitride and linear I-V showing Ohmic-like behavior can be achieved.

c. Thermal Properties of Porous III-Nitrides

The thermal conductivity across (or in the direction normal to) a multilayer structure having one or more alternating porous III-nitride/bulk III-nitride (interfacing) layers, where heat transfer is normal to the layers, consists of adding up thermal resistance from the alternating layers in series, which is expected to be dominated by the porous GaN layers. Conversely, in the case of lateral heat spreading, this involves summing up the thermal conductance/conductivity of layers in parallel, which will be dominated by the bulk (non-porous) III-nitride layers. It is believed that the inclusion of porous III-nitride layers in a multilayer structure provides an advantage of improved thermal conduction properties, where a device containing a such a multilayer structure can function at much lower operation temperatures, as compared to an equivalent device which does not contain porous III-nitride layers. Such improved thermal conductance is also believed to benefit the threshold, power, and efficiency of such heat generating devices.

The thermal conductivity can be tuned based on the porosities within the porous III-nitride layer and the wall thickness of the plurality of pores, such as of porous GaN, and can be vary from below 1 to more than 20 W/m·K. In some instances, the thermal conductivity of porous III-nitrides in the range of between about 1 to 25, 2 to 20, 2 to 15, or 2 to 10 W/m·K. In still some other instances, the average thermal conductivity of the porous III-nitrides is at least about 1, 2, 3, 4, 5, 6, 7, 8, 9, 10, 11, 12, 13, 14, or 15 W/m·K. In some cases, a reduction in porosity leads to a moderate improvement in thermal conductivity, as a result of an increased effective medium. Widening the pore wall thickness can also improve the thermal conductivity owing to much reduced phonon interaction at the pores. For porous III-nitride layers with large wall thicknesses and small porosities, the thermal conductivity is capable of reaching to more than 20 W/m·K, which is needed for practical usage of porous III-nitrides in photonic devices requiring fast heat dissipation.

III. Methods of Preparing Porous III-Nitrides and Alloys Thereof

Unlike the photoelectrochemical (PEC) methods previously used, the conductivity selective electrochemical (EC) etching methods rely on electrically injected holes, rather than photogenerated holes, to oxidize bulk layer(s) of doped III-nitrides, such as GaN. The methods do not require exposure to ultraviolet (UV) illumination. The etching behavior of the doped III-nitride is well controlled by the doping concentration and applied bias voltage. Thus, a variety of porous III-nitrides with different porosities and morphologies can be obtained by changing the type and concentration of the electrolyte, doping concentration of the III-nitride, and the etching applied bias voltage used during the selective electrochemical (EC) etching processes, as described below.

In one non-limiting method, porous III-nitride layer or layers are formed by the steps of:

(a) providing or depositing one or more layers of a III-nitride, such as aluminum nitrides, gallium nitrides, indium nitrides, and alloys thereof; wherein at least one of the layers of a III-nitride is doped with an n-type dopant; and (b) electrochemically (EC) etching the at least one of the layers of III-nitride which is doped with an n-type dopant in the presence of an electrolyte and under an applied bias voltage to form a plurality of pores therein.

The one or more layers of III-nitrides, such as GaN, can be epitaxially or homoepitaxially grown according to art known methods. In some instances, the III-nitride layer can be grown, for example, on a suitable substrate (i.e., c-plane of sapphire) by metal organic chemical vapor deposition (MOCVD). Each layer of III-nitride provided or deposited may have a thickness in a range of between about 1 to 1000 nm, 10 to 1000 nm, 10 to 500 nm. In instances where more than one layer of III-nitride is present each layer may be independently doped or undoped, as described below. In still some other instances, the one or more layers of III-nitrides alternate between doped or undoped layers allowing for controlled porosification of the doped layers.

Porosification of a layer or layers of III-nitrides requires that the bulk III-nitride layer(s) be doped with an n-type dopant. Accordingly, the one or more layer(s) may be doped during deposition/formation of the III-nitride layer(s).

Exemplary dopants can include, but are not limited to n-type Ge and Si dopants. Such dopant sources can include, for example, silane (SiH$_4$), germane (GeH$_4$), and isobutylgermane (IBGe). It is preferred that the III-nitrides which are porosified are aluminum free or substantially free of aluminum (where "substantially free" means less than about 5%, 4%, 3%, 2%, 1%, 0.9%, 0.8%, 0.7%, 0.6%, 0.5%, 0.4%, 0.3%, 0.2%, or 0.1% aluminum by weight in the doped III-nitride layer). The doping concentration can be uniform across the entirety of a III-nitride layer or the doping concentration may form a gradient (i.e., a III-nitride layer having a graded dopant concentration across an axis of the layer, such width). The doping concentration is considered high at doping concentration levels of at least about $1\times10^{20}$ cm$^{-3}$ or higher; or in the range of between about $0.5\times10^{20}$ cm$^{-3}$ to $10\times10^{20}$ cm$^{-3}$. The doping concentration is considered to be moderate at doping concentration levels of greater than about $1\times10^{18}$ cm$^{-3}$ to less than $1\times10^{20}$ cm$^{-3}$, $2\times10^{18}$ cm$^{-3}$ to less than $1\times10^{20}$ cm$^{-3}$, $3\times10^{18}$ cm$^{-3}$ to less than $1\times10^{20}$ cm$^{-3}$, $4\times10^{18}$ cm$^{-3}$ to less than $1\times10^{20}$ cm$^{-3}$, or $5\times10^{18}$ cm$^{-3}$ to less than $1\times10^{20}$ cm$^{-3}$. In some instances, the moderately doped concentration level is in the range of $1\times10^{19}$ cm$^{-3}$ to less than $1\times10^{20}$ cm$^{-3}$ or in the range of about $0.5\times10^{19}$ cm$^{-3}$ to $10\times10^{19}$ cm$^{-3}$. The doping concentration is considered to be low at doping concentration levels of less than about $1\times10^{18}$ cm$^{-3}$ or in the range of between about $0.5\times10^{18}$ cm$^{-3}$ to $10\times10^{18}$ cm$^{-3}$. Porosification by electrochemical (EC) etching is generally limited to III-nitrides which are doped at moderate to high concentrations and low doping concentrations are not porosified under the EC etching conditions. In some instances, the doping concentration within the one or more layers of III-nitride doped with an n-type dopant changes in a gradient function across a defined thickness within the layer, where the defined thickness is about 5, 10, 15, 20, 25, 30, 35, 40, 45, 50, 55, 60, 65, 70, 75, 80, 85, 90, 95, 100, 200, 300, 400, 500 nm within the layer. In such instances, the EC etching process of step (b) porosifies the gradient function based on the doping concentration, where low doping concentration and non-doped parts of the layer are not porosified. This can produce a single layer of III-nitride having a gradient porosity across the defined thickness where the porosity also changes across the thickness and can range from between about 10% and 90% or 20% and 80%.

In some instances, interfacing layers of III-nitrides may each have different doping concentrations from one another and the interfaces between the layers are characterized by sharp/abrupt difference in doping concentrations. Sharp/abrupt differences generally refer to differences in doping concentration from no doping or low doping to moderate or high doping concentration, where the change occurs across a thickness of less than 100, 90, 80, 70, 60, 50, 40, 30, 20, 10 nm, or less. In some cases, the layers may alternate between doped and undoped III-nitrides. For example, the layers may include doped GaN/undoped GaN in alternating pairs. In some other instances, to prevent such abrupt/sharp changes in the doping concentrations between layers, the doping profile can be controlled across the width (i.e., thickness) of a doped layer or layers, such that the concentration changes in a gradient fashion from a low to a high concentration, a low to a moderate concentration, a moderate to a high concentration, or a low to a moderate to a high concentration across the width (i.e., thickness) of the one or more doped layer or layers. The change in the gradient is typically a linear change by controlling the dopant source flow over a period of time during the deposition/formation of the III-nitride layer.

Figure 2A:
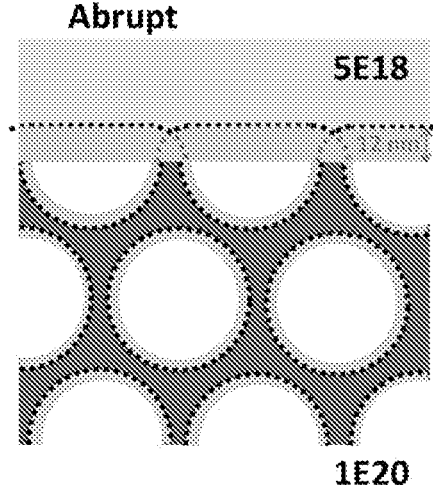
FIG. 2A is a non-limiting representation of a porous GaN morphology (white area) and depletion regions (areas enclosed by dotted lines) of an abrupt interface between high and low doping levels.
Figure 2B:
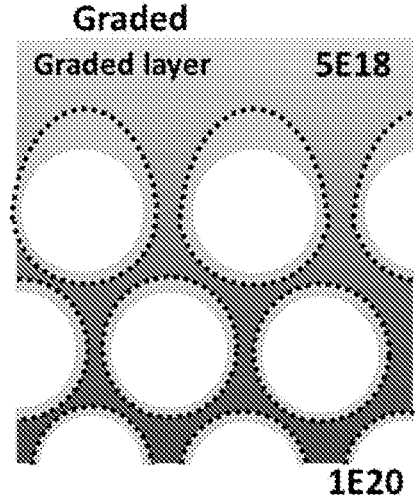
FIG. 2B is a non-limiting representation of a porous GaN morphology (white area) and depletion regions (areas enclosed by dotted lines) of a graded (gradient) doping profile between high and low doping levels.

It is preferred to avoid abrupt/sharp changes in the doping concentration differences between interfacing III-nitride layers in order to prevent current blocking which could occur at abrupt/sharp interface, such as between a doped III-nitride/bulk III-nitride layers or highly doped III-nitride/lowly doped III-nitride layers. Gradient doping allows for controlled manipulation of the depletion width between the highly doped porous III-nitride layers and lowly doped or undoped bulk III-nitride layers. The thickness of the gradient or graded layer between highly doped porous III-nitride layers and lowly doped or undoped bulk III-nitride layers can range from between about 5 to 100 nm, 5 to 75 nm, 5 to 50 nm, or 5 to 25 nm with dopant concentration linearly changing across the thickness of the layer. In some cases the doping gradient (or graded layer) thickness is about 5, 10, 15, 20, 25, 30, 35, 40, 45, 50, 55, 60, 65, 70, 75, 80, 85, 90, 95, 100 nm thick. It is possible to change from high doping ($1\times10^{20}$ cm$^{-3}$) to moderate doping ($5\times10^{18}$ cm$^{-3}$) within a certain width by linearly changing the dopant source flow during layer deposition over a defined period of time to control the thickness and doping concentration of the doping gradient (or graded layer). Compared to the abrupt interface, such a gradient doping technique allows for altering the pore morphology (from semicircular to ellipsoidal), as well as degree of porosity at porous III-nitride/bulk III-nitride interfaces, and provide available current pathways and avoid the issue of current blocking (FIG. 2B). In certain instances, there is thickness limit to the gradient that can be used in a device, such as a DBR structure, since the thicknesses of the individual layers are expected to be on the order of about 50 nm.

In some instances of the methods described, an optional current spreading layer with n-type doping, such as of at least about $5\times10^{18}$ cm$^{-3}$, is present on the layer(s) of III-nitride in order to ensure uniform current distribution during the electrochemical (EC) etching.

The porosification of the doped III-nitride layer(s) proceeds by an electrochemical (EC) etching process of step (b). Different porosities and pore morphologies may be obtained by changing the type and concentration of electrolyte, doping concentration, and applied bias voltage (as discussed below). The applied bias voltage is typically a positive voltage in the range of about 0.1 to 10 V, 1.0 to 5V, or 1.0 to 2.5V, or one or more voltage values within the aforementioned ranges. The electrochemical porosification is conducted in the electrolyte where the III-nitride layer(s) acts as the anode (under a positive bias) in the presence of a cathode (under negative bias), such as a platinum wire. The electric field direction during the EC etching process can control the direction of the etching direction and thereby control the direction of the pores etched into the bulk doped III-nitride layer. In some instances, vertical etching produces columnar pores which are vertically aligned, while in some other instances lateral etching produces columnar pores which are laterally aligned.

During step (b) of the methods, the EC etching direction is determined by the electric field direction. Depending on the III-nitride/electrolyte interface, the EC etching can be controlled to be in a vertical etching or lateral etching direction. The rate of vertical or lateral porosification during step (b) can be about 1 µm/min, 2 µm/min, 3 µm/min, 4 µm/min, 5 µm/min, 6 µm/min, 7 µm/min, 8 µm/min, 9 µm/min, or 10 µm/min. The EC etching of step (b) can be carried out under an applied bias voltage for about 1 min to 2 hours, 1 min to 1 hour, or 1 min to 30 minutes. In some instances, the EC etching of step (b) is carried out under an applied bias voltage for at least about 5 min, 10 min, 15 min, 20 min, 25 min, 30 min, 35 min, 40 min, 45 min, 50 min, 55 min, or 60 min. The EC etching of step (b) can be carried out under an applied bias voltage at room temperature or at a temperature in the range of about 10° C. to about 50° C. The EC etching of step (b) can be carried out under an applied bias voltage under ambient conditions or optionally under an inert atmosphere (such as of nitrogen or argon).

The EC etching carried out in step (b) of the methods described can be carried out in different types and concentrations of a high conductivity electrolyte (either salt or acid). Exemplary high conductivity electrolytes can include, but are not limited to aqueous solutions of hydrofluoric acid (HF), nitric acid (HNO3), and organic acids, such as oxalic acid, and their salts. The concentration of the electrolyte solutions are typically in the range of between about 0.1 and 25 M, 0.1 and 20 M, 0.1 and 15 M, 0.1 and 10 M, 0.1 to 5 M, 0.1 and 1M.

In instances where a lateral etching direction occurs, the III-nitride layer(s) may be optionally covered by a (protective) silicon dioxide (SiO₂) layer deposited thereon by a suitable technique, such as by plasma-enhanced chemical vapor deposition (PECVD) and lithographically patterned with 1D array of trenches of openings known as "via trenches". Suitable etching techniques, such as inductively coupled plasma reactive-ion etching (ICP-RIE), can be used to etch down III-nitride layer(s) to expose the n-doped layer(s) sidewalls. After EC etching process, the protective SiO₂ can be stripped off using a suitable technique, such as buffered oxide etch (BOE).

The conductivity selective electrochemical (EC) etching process of step (b) is believed to proceed by an anodic etching reaction which involves four steps:

(1) charge carrier transport in the space-charge region;
(2) oxidation of the doped III-nitride surface;

(3) dissolution of oxides formed; and
(4) transport of products.

The III-nitride/electrolyte interface is understood to behave as a Schottky diode. Under a positive bias, holes ($h^+$) are generated near the surface of the doped III-nitride by tunneling or impact ionization and the holes are swept by electric field onto the III-nitride surface for subsequent oxidation reaction. As an example, the oxidation of GaN generates $Ga^{3+}$ ions and nitrogen gas (Youtsey, et al. Appl. Phys. Lett. 71, 2151-2153 (1997)).

$$GaN + 3h^+ \rightarrow Ga^{3+} + \tfrac{1}{2}N_2 \uparrow$$

Near the cathode, hydrogen gas is formed by hydrogen ion reduction reaction.

$$H^+ + e^- \rightarrow \tfrac{1}{2}H_2 \uparrow$$

The reduction reaction completes the charge transfer circle of the electrochemical (EC) process. By using highly conductive electrolyte and a large Pt/electrolyte contact surface, the voltage drop at the cathode becomes negligible and can be ignored.

During the EC etching process of step (b), porosification is believed to result from random electrostatic breakdown with the injection of holes ($h^+$) to certain localized hot spots, resulting in the formation of porous nucleates through localized dissolution in the doped III-nitride layer(s). After the initial formation of pore nucleates, pore formation is driven by the electric field. The electric field around the planar depletion region (with width d and barrier height Φ) and at the tip of the pores (with radius r) are described according to the following functions:

$$E_{planar} = \frac{2\Phi}{d} \text{ and } E_{pore-tip} = \frac{\Phi}{r},$$

respectively (Chen, et al. J. Appl. Phys. 112, 064303 (2012)). Usually the pore tip radius is much smaller than the depletion layer width d, thus the porosification is believed to occur the fastest at the pore tips, resulting in columnar porous structures. Both aligned and branch-like or bifurcating pores can also be observed under certain doping concentrations and applied biases (FIG. 3A). The difference in pore morphology can be understood by comparing the inter-pore spacing (or wall thickness $d_w$ that is related with the initial pore nucleation density) and the space charge region width ($d_{sc}$). When $d_w > 2 d_{sc}$, sufficient current pathways exist between pores and reverse breakdown takes place in between pores and at the tips, causing branching and bifurcation of pores in additional to parallel pore propagation. When $d_w < 2 d_{sc}$, arranged pore morphologies can be obtained due to the coalescence of the depletion regions around adjacent pores.

Figure 4:
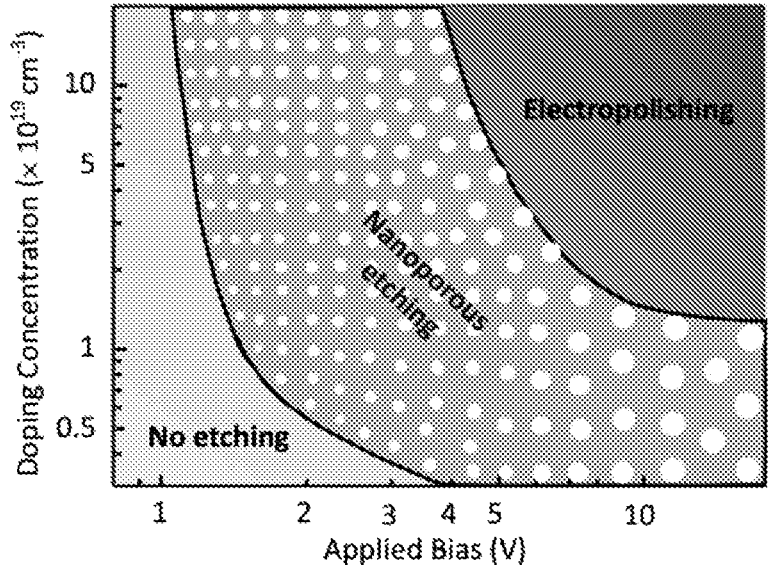
FIG. 4 is a phase diagram for an electrochemical (EC) etching process as a function of doping concentration (y-axis) and applied bias (x-axis).

The degree of porosity of doped III-nitride layer(s) can be controlled as a function of two parameters: the doping (carrier) concentration and the anodization or applied bias voltage. As shown in FIG. 4, an EC etching phase diagram systematically maps the porosity of an exemplary porous GaN layer with respect to the n-type doping concentration and applied voltage. The EC etching phase diagram can be divided into three regions. When the applied bias or the doping concentration is low, no chemical reactions occur and GaN remains intact and no EC etching occurs. As the applied bias and/or the doping concentration is increased, electrostatic breakdown occurs with the injection of holes ($h^+$) into certain localized hot spots, resulting in the formation of porous structures through localized dissolution. At higher applied bias and/or with a higher doping concentration, electropolishing (i.e., complete etching) can occur instead.

Within the porous region of the EC etching regime, as shown in FIG. 4, the pore morphology can be controlled by the doped III-nitride layer's conductivity and the anodic bias voltage. The porosity increases with increasing applied bias and higher doping concentration, while the pore size reduces with lower bias and lower doping concentration. The pore wall thickness (or spacing between adjacent pores) increases with lower bias and lower doping concentration. By changing the anodization voltage and doping concentration, it is possible to systematically cover a large portion of the parameter space for purposes of porous etching. By controlling the EC etching parameters of step (b) of the methods morphological parameters, such as the extent of porosity, average pore size, and the average pore wall thickness (or inter-pore spacing) can be controlled/tuned. Accordingly, the doping/gradient profiles of a III-nitride layer and the EC etching conditions can be used to tailor pore morphology, as discussed in detail here and in other relevant parts of this disclosure. In certain instances, it is possible to apply increasingly reduced doping concentration and increased applied bias at the same time, such that the porous III-nitride has increased wall thicknesses, while approximately having the same degree of porosities.

Through controlled EC etching methods, as discussed above, doped III-nitride layers can be formed into porosified III-nitride layers and can have porosities in the range of between about 10% and 90% or 20% and 80%. In some instances, the porosity is at least about 10%, 20%, 30%, 40%, 50%, 60%, 70%, 80%, or 90%. In some instances, the porosities change in a graded manner across a thickness within a given layer of porosified III-nitride, based on the doping gradient formed therein. Thus, the porosity of a given III-nitride layer following electrochemical (EC) etching is typically uniform across the given porosified layer, but may also be non-uniform.

The incorporation of low index materials, such as air, into porosified III-nitrides can lower the refractive index of the bulk III-nitride. The controlled EC etching methods allow for varying the volumetric ratio of air (or porosity), porous III-nitrides demonstrate tunability in their refractive index. The refractive index (n) of a porosified or porous III-nitride disclosed herein is in the range of between about 1 and 2.6 dependent on the degree of porosity (i.e., amount of air in the porous III-nitride), where the refractive index of air is about 1 (at STP) and the refractive index of a bulk (non-porous) III-nitride is about 2.6. In some cases, the porous III-nitride has a refractive index of about 1.1, 1.2, 1.3, 1.4, 1.5, 1.6, 1.7, 1.8, 1.9, 2, 2.1, 2.2, 2.3, 2.4, or 2.5. In certain instances, the refractive index of a porous III-nitride, such as a porous GaN, is about 2.2 when the porosity is about 20%, about 1.9 when the porosity is about 40%, about 1.6 when the porosity is about 60%, or about 1.3 when the porosity is about 80%. The porosified III-nitrides which interface other III-nitrides (porous or non-porous (bulk) nitrides) can have a different index of refraction than the index of refraction of the (bulk) III-nitride. This difference represents the refractive index contrast ($\Delta n$). It is preferred that the refractive index contrast between porosified III-nitride layer(s) and other III-nitrides is high and that $\Delta n$ is greater than 0.4 and more preferably greater than 0.5. In some instances, $\Delta n$ between porosified III-nitride layer(s) and other III-nitrides is at least about 0.5, 0.6, 0.7, or 0.8.

The controlled EC etching methods which allow for varying the volumetric ratio of air (or porosity) of the porous III-nitride, such as GaN, can also be used to tune the electrical properties of the porous III-nitride, as compared to the bulk (non-porous) equivalent III-nitride. In some instances, the porosification of III-nitride, results in about an order of magnitude decrease in the electron concentration after the EC etching process has occurred. For example, in a doped III-nitride prior to porosification which was doped above $1 \times 10^{20}$ cm$^{-3}$, the resulting porous III-nitride layer(s) with a porosity of at least about 5%, 10%, 20%, 30%, 40%, 50%, or 60% can maintain a carrier (electron) concentration of above about $5 \times 10^{18}$ cm$^{-3}$ and electrical mobilities of at least about 50, 60, 70, 80, 90, 95 cm$^2$/V s, or greater.

The methods allow for the thermal conductivity of III-nitrides to be tuned based on the porosity and wall thickness of the resulting porosified III-nitride. These can be varied from below 1 to more than 20 W/m·K. In some instances, the thermal conductivity of porous III-nitrides in the range of between about 1 to 25, 2 to 20, 2 to 15, or 2 to 10 W/m·K. In still some other instances, the average thermal conductivity of the porous III-nitrides is at least about 1, 2, 3, 4, 5, 6, 7, 8, 9, 10, 11, 12, 13, 14, or 15 W/m·K.

IV. Methods of Using Porous III-Nitrides and Alloys Thereof

The porous III-nitrides, such as porous GaN, and multilayer structures containing porous III-nitrides (i.e., having alternating layers of porous GaN/bulk (non-porous) GaN) and fabricated according to the electrochemical (EC) etching processes/methods can be used in electronic, photonic, and optoelectronic applications. These can include, but are not limited to, light-emitting diodes (such as, resonant-cavity LEDs (RC-LEDs)), field-effect transistors, laser diodes (vertical-cavity surface-emitting lasers (VCSELs)), bio-platforms, and water splitting. The porous III-nitrides, such as porous GaN, and multilayer structures containing such porous III-nitrides can be prepared according to the methods and these can be incorporated into different devices using art known techniques.

Figure 9A:
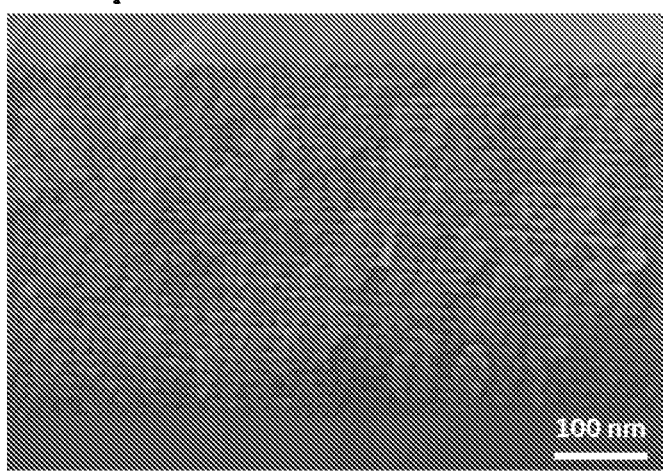
FIG. 9A shows an SEM image of a porous GaN structure etched at 1.3 V with an abrupt doping interface.
Figure 9B:
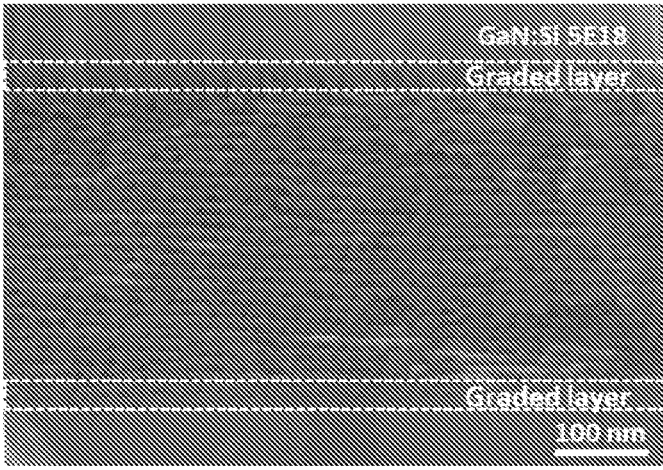
FIG. 9B shows an SEM image of a porous GaN structure etched at 1.3 V with a graded (doping) layer of 50 nm in thickness.

In some instances, the porous III-nitrides form part of multilayer structures include alternating layers/pairs of porous III-nitride/bulk (non-porous) III-nitride where there are interfaces formed between each porous III-nitride/bulk (non-porous) III-nitride. To prepare these types of structures it is possible to prepare, for example, layers of III-nitrides wherein at least some of the layers are sufficiently doped with a dopant that applying an electrochemical etching process porosified, selectively, those layers which are sufficiently doped. Prior to porosification, these multilayer structures may be alternating formed of pairs of layers of doped III-nitride and undoped III-nitride layers. Following porosification by EC etching, these multilayer structures alternating pairs result in porosified III-nitride and non-porous (bulk) III-nitride layers. It is preferred for the alternating pairs of porosified III-nitride and non-porous (bulk) III-nitride layers to be formed of the same III-nitride in order to have the same lattice constant. Each alternating pair represents a distributed Bragg reflector (DBR) where in some instances there may be 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, or greater alternating pairs in a multilayer structure. Generally, the number of interfaces in a given DBR structure comprising porous III-nitride/bulk (non-porous) III-nitride interfaces is twice the number of alternating pairs, such that, for example, a 20 pair DBR should have 40 interfaces. The interfaces, as described in detail above, can be abrupt interfaces or can have a graded/gradient layer profile between the interfacing porous III-nitride and bulk (non-porous) III-nitride, as shown in FIGS. 9A and 9B. The graded/gradient layer profile can have a suitable thickness as described elsewhere. In certain instances, such as those exemplified below, the DBRs including alternating pairs of porous GaN/GaN.

Porous-III-nitride/bulk (non-porous) III-nitride DBRs can exhibit high reflectance/reflectivity values where the peak reflectance is at least about 99%, 99.1%, 99.2%, 99.3%, 99.4%, 99.5%, 99.6%, 99.7%, 99.8%, or 99.9%. It is most preferred for the reflectance to be at least 99.5% or greater. For Porous-III-nitride/bulk (non-porous) III-nitride DBRs it is also possible to reproducibly obtain a stopband (range of wavelengths reflected by the DBR structure) of at least about 50, 60, 70, or 80 nm in range. The peak wavelength of the stopband can be varied up to 10, 20, 30 nm for a blue porous-III-nitride/bulk (non-porous) III-nitride DBR. In some instances, peak reflectances exceeding 99.8%, at a central wavelength of 460 nm with a stop band of more than 50 nm can be achieved.

The porous-III-nitride/bulk (non-porous) III-nitride DBR mirrors can have tuned emission in the blue (440 nm), green (520 nm), and red (600 nm) wavelength range. In the blue range, emission may occur at a peak value of about 440, 450, or 460 nm. In the green range, emission may occur at a peak value of about 520 nm. In the red range, emission may occur at a peak value of about 600 nm. Other peak values in the blue, green, and red wavelength ranges are possible. Further, emission may also be at near ultraviolent, ultraviolet, near infrared, and infrared wavelengths.

The area of the porous-III-nitride/bulk (non-porous) III-nitride DBRs region can be sufficiently large for the fabrication of vertical-cavity surface-emitting lasers (VCSELs) and resonant-cavity LEDs (RC-LEDs). In some instances the area of the DBR region is at least about or can exceed about 10, 20, 30, 40, or 50 μm.

The inclusion of porous GaN-containing reflectors/mirrors provides the option of a conductive mirror to support vertical current injection vital in attaining high performance VCSELs with excellent optical and electrical performance, as compared to previously reported VCSELs. VCSELs have many advantages compared to more commonly used edge emitting laser diodes (EELDs) such as superior beam quality, compact form factor, low operating power, cost-effective wafer-level testing, higher yield and lower cost in manufacturing. VCSELs, in general, are expected to find important applications in various fields including information processing, micro-display, pico-projection, laser headlamps, high-resolution printing, biophotonics, spectroscopic probing, and atomic clocks.

The porous-III-nitride/bulk (non-porous) III-nitride DBRs which can be used in fabricating VCSELs which address major issues known in conventional III-nitride VCSELs such as the lack of a sufficiently low refractive index material that is lattice matched to bulk III-nitride, such as GaN. This is addressed by the tunable refractive index of the controllably porosified III-nitrides, such as porous GaN, described.

EXAMPLES

Example 1: Conductivity Selective Electrochemical Porosification of GaN

Materials and Methods

Figure 5A:
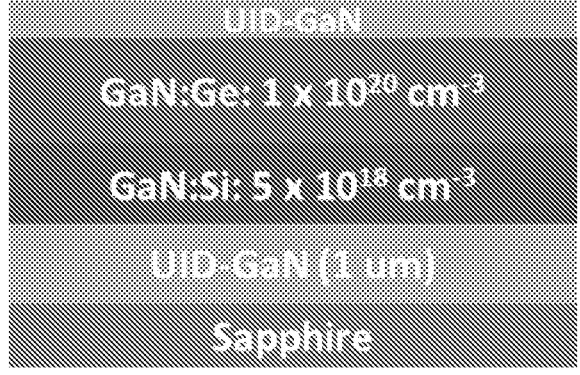
FIG. 5A is a non-limiting schematic representation of an as-grown epitaxial GaN structure.
Figure 5B:
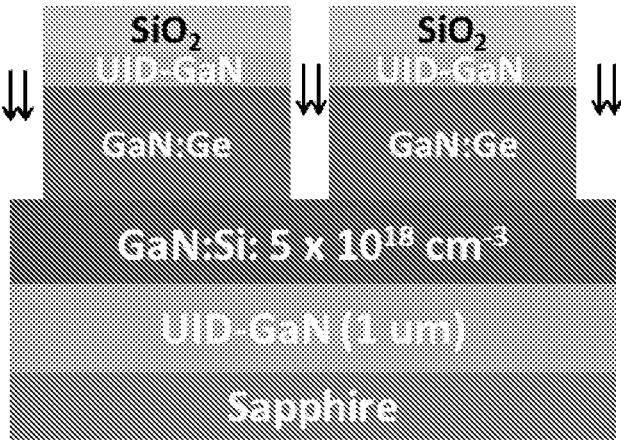
FIG. 5B is a non-limiting schematic representation of the cross-sectional schematic of stripe mesas with via trenches opened by dry etching (denoted by arrows).
Figure 5C:
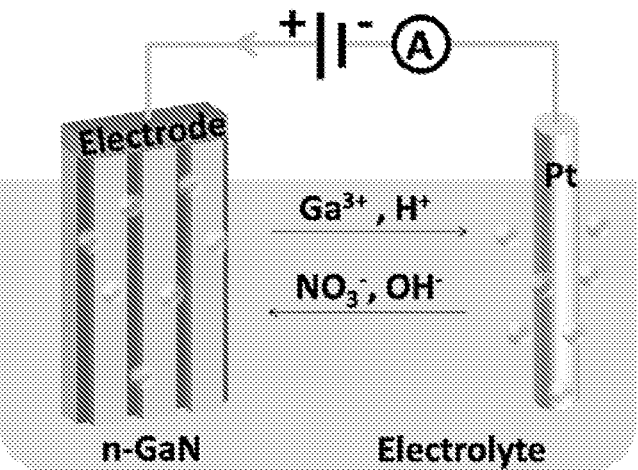
FIG. 5C is a non-limiting schematic representation of the experimental setup used during GaN EC etching, with ion/mass transport denoted by arrows, nitrogen and oxygen gases shown generated near the anode and hydrogen gas generated at the cathode, as denoted by bubbles.

Porous GaN structures were prepared as shown in FIGS. 5A and 5B. Electrochemical porosification was conducted in an electrolyte of concentrated nitric acid at room temperature with n-type gallium nitride (GaN) as the anode under a positive bias (FIG. 5C) and a platinum wire as the cathode under a negative bias. The anodization process was carried out without UV illumination under constant voltage of 1-5 V controlled by a Keithley 2400 source meter, while the etching current is recorded. After anodization, porosified GaN samples were rinsed with deionized (DI) water and dried under a stream of $N_2$.

Characterization:

Scanning electron microscopy (Hitachi SU-70) was used to study the pore morphology of the porosified GaN layers (not shown).

Example 2: Hall and Porosity Measurements of Single Layers of Porous GaN

Materials and Methods

The electrical conductivity of porous GaN prepared according to the method of Example 1 was measured using van der Pauw Hall measurement. After growth of a 400 nm thick Ge-doped GaN layer on 1 μm un-doped GaN, the 2" wafer was cut into several small pieces (apparently 1.5 cm×1.5 cm) denoted as Samples A, B, C, and D. Samples A-D were EC etched each with a different bias to create porous GaN layers with different porosities. The EC etching was performed in vertical direction and the pore alignment was perpendicular to the growth surface.

Characterization:

Porosity was measured by weighing Samples A-D before and after the EC etching process was carried out and porosity was calculated based on the weight difference (Table 1). Porosity was also measured from SEM images of the porous GaN structures by an image processing software called ImageJ. The two methods showed very good agreement with a difference in porosity within ±5%.

TABLE 1

Measured weight and calculated porosity of porous GaN using micro balance method, measured porosity by SEM, and electron concentration and mobility measured by van der Pauw Hall measurement

| Sample | Weight before etching (g) | Weight after etching (g) | Sample size or etched area ($cm^2$) | Porosity by micro balance | Porosity by SEM | Electron concentration ($cm^{-3}$) | Mobility ($cm^2$/V-s) |
|---|---|---|---|---|---|---|---|
| A | 0.5780 | 0.5777 | 2.88 | 0.32 | 0.30 | 1.16E19 | 93.0 |
| B | 0.2658 | 0.2656 | 1.46 | 0.42 | 0.45 | 6.18E18 | 79.9 |

TABLE 1-continued

Measured weight and calculated porosity of porous GaN using micro
balance method, measured porosity by SEM, and electron concentration
and mobility measured by van der Pauw Hall measurement

| Sample | Weight before etching (g) | Weight after etching (g) | Sample size or etched area (cm$^2$) | Porosity by micro balance | Porosity by SEM | Electron concentration (cm$^{-3}$) | Mobility (cm$^2$/V-s) |
|---|---|---|---|---|---|---|---|
| C | 0.4269 | 0.4265 | 2.40 | 0.51 | 0.49 | 4.32E18 | 84.4 |
| D | 0.4297 | 0.4294 | 2.28 | 0.54 | 0.59 | 3.71E18 | 94.6 |

Figure 6A:
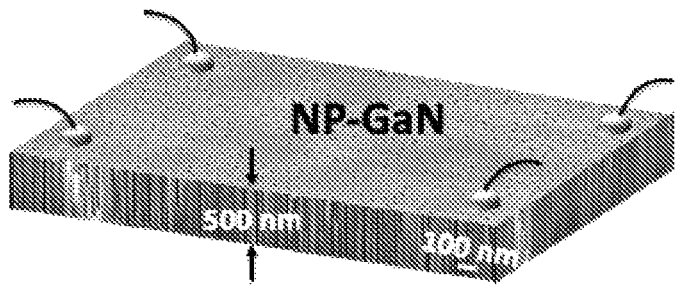
FIG. 6A is a schematic representation of Van der Pauw Hall measurement setup for porous GaN layers, where "NP" denotes nanoporous GaN.
Figure 6B:
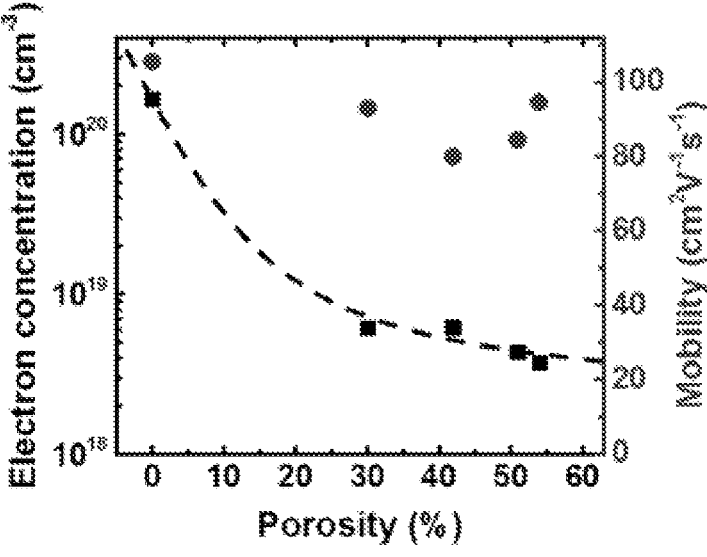
FIG. 6B is a graph of the electron concentration (squares; left y-axis) and mobility (circles; y-right axis) with respect to porosity (x-axis) in the porous GaN.

Hall measurement with Van der Pauw configuration was used to measure the electron concentration and mobility of the porous GaN single layers. FIG. 6A shows a schematic of the measurement setup and FIG. 6B shows the electron concentration and mobility as functions of the porosity (measured by weighing method).

Although there was about an order of magnitude decrease in the electron concentration after the EC etching process occurred, given that the n$^{++}$-GaN before porosification was typically doped above 1×10$^{20}$ cm$^{-3}$, the porous layers with a porosity of 40% maintained a carrier concentration above 5×10$^{18}$ cm$^{-3}$. The measured carrier concentration was before volume porosity correction. The electron mobility (right axis of FIG. 6B) remained the same after the EC etching process. Thus, the Hall measurement showed that the porous GaN layers remained highly conductive even after EC etching.

Example 3: Vertical Electrical Transport Through a Porous GaN/GaN Interface

Materials and Methods

The Hall method used in Example 2 only measures horizontal transport. Porous GaN integrated with other bulk GaN layers form interfaces, such as in distributed Bragg reflector (DBR) mirrors with multiple porous GaN layers and porous GaN/GaN interfaces, thus it is important to measure the vertical electrical transport property directly from a DBR stack.

Figure 7A:
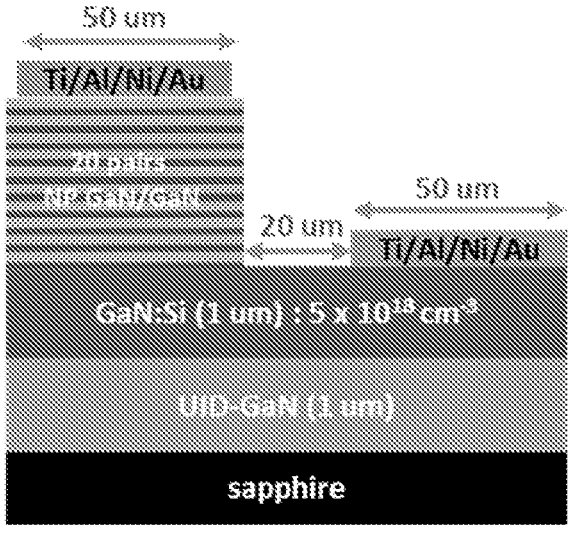
FIG. 7A is a non-limiting schematic representation for electrical characterization of a 20-pair porous-GaN/GaN DBR.

A 20-pair porous GaN/GaN DBR with the structure shown in FIG. 7A was fabricated. The n$^+$-GaN/GaN DBR stack was firstly dry etched into stripe mesas, and then EC etched into porous GaN/GaN DBRs according to the methods described. A 50 micron metal stack of Ti/Al/Ni/Au was deposited on the mesa top as well as on the bottom surface (not shown).

Figure 7B:
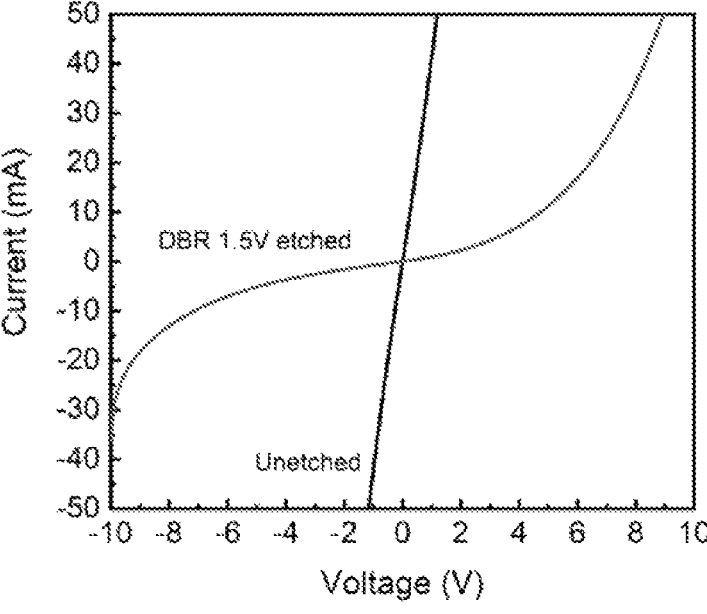
FIG. 7B is a graph showing the current-voltage (I-V) characteristic of a porous GaN/GaN DBR (curved line), etched at 1.5 V, as compared with that of a reference DBR sample that was not EC etched (straight line).

Characterization:

Electrical measurements were conducted by sweeping voltage between the top and bottom metal stacks. As shown in FIG. 7B, the current-voltage (I-V) characteristic of the porous GaN/GaN DBR (curved line) is compared with that of a reference DBR sample that was not EC etched (straight line). It is seen that the porous GaN/GaN DBR showed a nonlinear I-V while the reference sample that was not EC etched had a normal Ohmic behavior.

To understand the non-linear, diode-like I-V behavior of the porous GaN/GaN structure, attention was given to the interface between porous GaN/GaN layers, since the porous GaN itself showed good conductivity. It is well known that III-V DBRs often utilize a graded bandgap (or composition) at interfaces to smoothen bandgap misalignment induced voltage drops. Abrupt doping profile have also been shown to cause band misalignment and result in both an increase of impedance and diode-like I-V behavior.[5] However, the band bending between a highly doped porous GaN (N$_{D\text{-}porous\ GaN}$~1×10$^{20}$ cm$^{-3}$) and a moderately doped GaN (N$_{D\text{-}GaN}$~5×10$^{18}$ cm$^{-3}$) is calculated to be negligible (<0.03 V) (Schubert, et al. Appl. Phys. Lett. 71, 921-923 (1997)). Therefore, even in 20 pairs of DBRs with 40 interfaces, the total voltage drop is only expected add up to no more than ~1.2 V, which cannot explain the diode-like behavior as shown in FIG. 7B. Thus, the property of porous GaN/GaN interfaces seem to be different from the conventional semiconductor interfaces with doping contrasts.

Example 4: Doping Gradients at Porous GaN/GaN Interfaces

Materials and Methods

Figure 8:
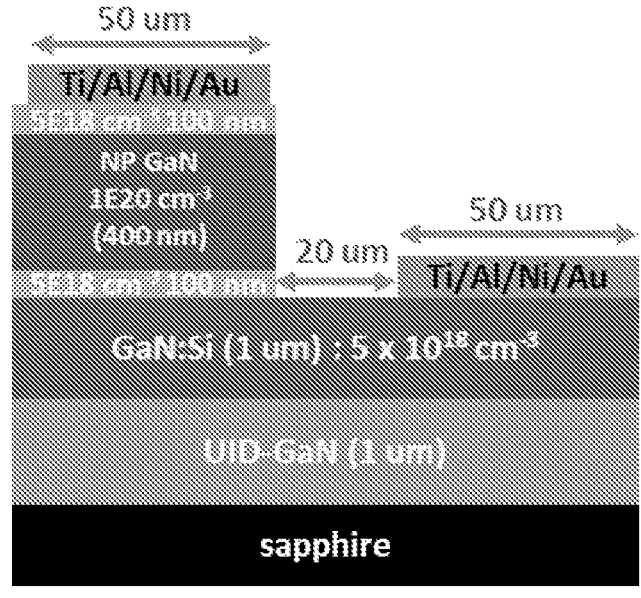
FIG. 8 shows a non-limiting schematic used for electrical characterization of porous-GaN/GaN interfaces.

Electrical transport measurements on a simplified porous GaN structure, as shown in FIG. 8, were carried out. In the structure, a 400 nm-thick porous GaN layer with a doping concentration of 1×10$^{20}$ cm$^{-3}$ (prior to EC etching) was sandwiched by two 100 nm-thick, moderately doped GaN layers with concentration of 5×10$^{18}$ cm$^{-3}$. This structure represents a simplification of DBR structures, with only one porous GaN layer and two porous GaN/GaN interfaces.

In addition to the case of an abrupt interface, a doping gradient of 20 nm, 50 nm, and 100 nm thick with dopant concentration linearly changing from 5×10$^{18}$ cm$^{-3}$ to 1×10$^{20}$ cm$^{-3}$ was also studied.

Characterization:

Cross-sectional SEM images of the porous GaN structures with an abrupt and 50 nm thick graded or gradient doping interfaces are shown in FIGS. 9A and 9B. It can be seen from the SEM images that the porous layers with graded or gradient doping showed a different pore morphology at the interface where they are elongated towards the lower doped region, although they are not exactly ellipsoidal in shape.

Figure 10:
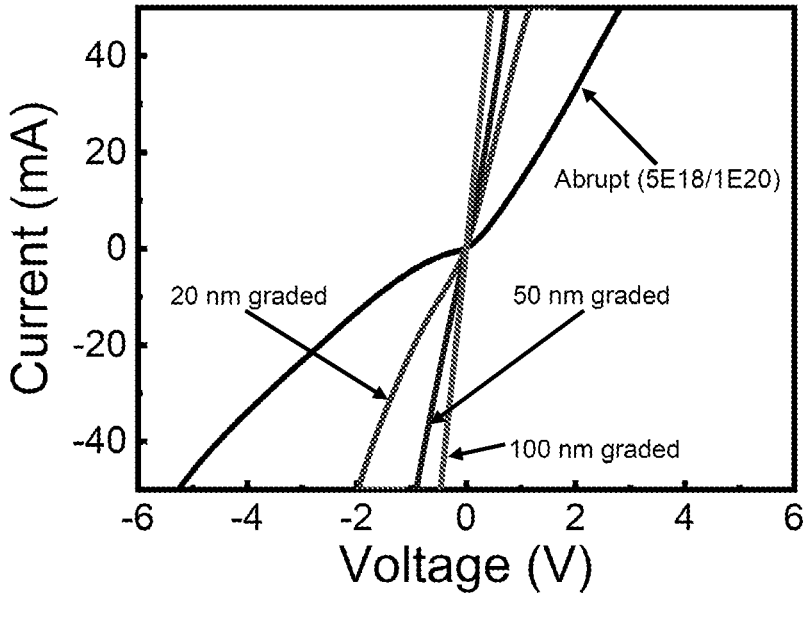
FIG. 10 shows a graph of the electrical characterization of porous-GaN/GaN interfaces, showing an abrupt interface and different graded doping layer thicknesses of 20, 50, and 100 nm.

The I-V characteristic of the mesa structures are shown in FIG. 10. By changing from an abrupt interface to graded interface, the I-V curve changed from nonlinear to linear, and a clear trend in resistance reduction was seen with increase in the graded layer thickness. The 100 nm graded sample showed a low resistivity of ~0.01 Ohm-cm, corresponding to an equivalent doping concentration of 5×10$^{18}$ cm$^{-3}$ and a mobility of 100 cm$^2$/(V·s). Such a low resistivity is in agreement with the Hall measurement result for a porous GaN with a porosity of 47%. The vertical electrical transport experiments confirmed that the graded interface helped to solve the current pinch-off issue and open up sufficient current pathways through the porous GaN/GaN interfaces.

Example 5: Thermal Properties of a Porous GaN DBR Mirror

Materials and Methods

Two porous GaN DBR structures were fabricated each consisting of 35 alternating n$^+$-GaN (N$_d$=4×10$^{19}$ cm$^{-3}$) and UID-GaN (UID=unintentionally doped) layers were etched at 1.3 and 1.5 V, respectively.

Figures 11A, 11B:
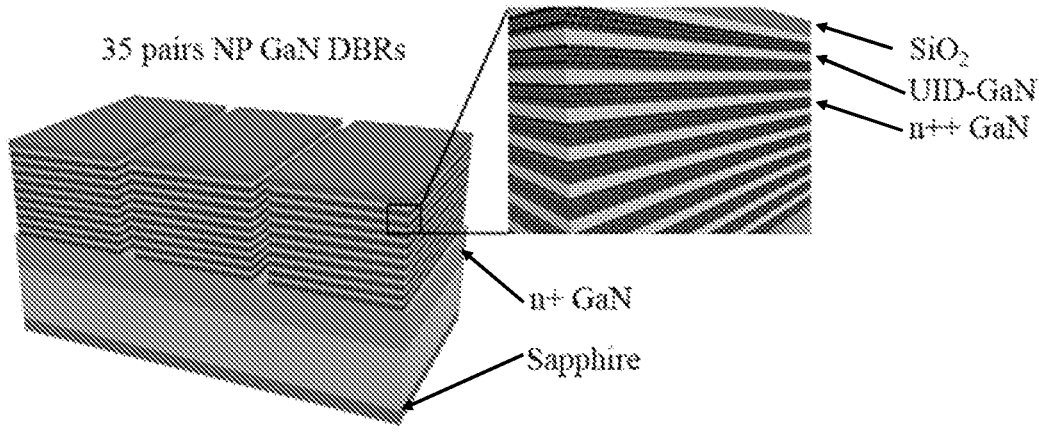
FIGS. 11A and 11B show non-limiting schematic structures of a DBR mirror with porous-GaN layers.
Figure 11C:
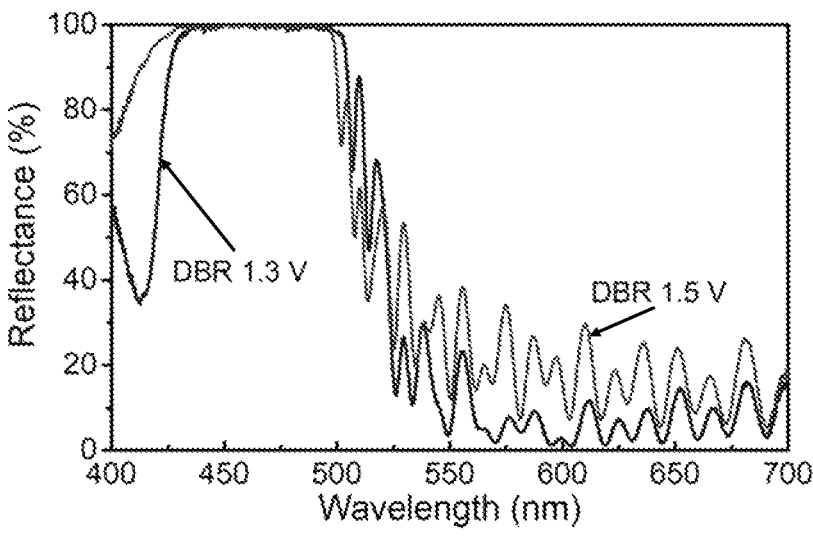
FIG. 11C shows a graph of the experimentally measured reflectance spectra of porous GaN DBRs etched at 1.3 V and 1.5 V.
Figure 11D:
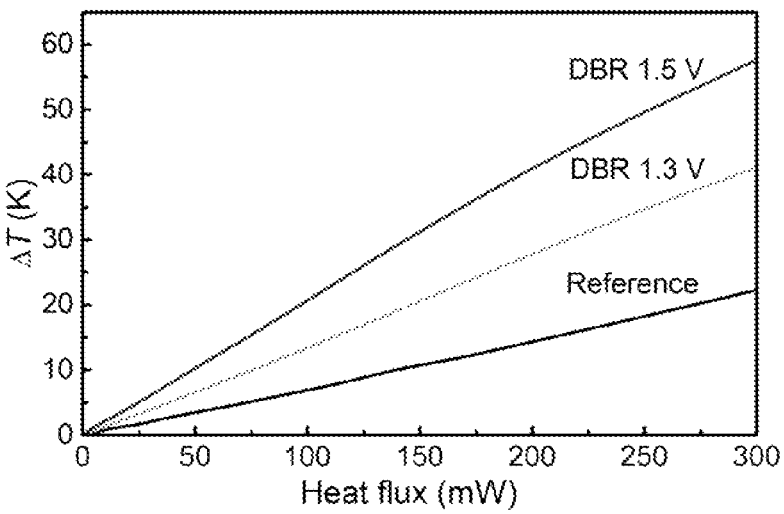
FIG. 11D shows a graph of the temperature increases of the Ni micro-heater $\Delta T$ as a function of Joule heating power at thermal equilibrium in porous GaN DBRs etched at 1.3 V and 1.5 V, as well as a reference sample.

Characterization:

FIGS. 11A-11C shows the schematic structure of the DBR and cross-sectional SEM images of the GaN/Porous-GaN DBR mirrors etched at 1.3 and 1.5 V revealed porosities of 24% and 36%, respectively. Reflectance of the two DBR samples (FIG. 11C) showed peak reflectances exceeding 99.8%, at a designed central wavelength of 460 nm, with a stop band of more than 50 nm. FIG. 11D shows the temperature increases of the Ni micro-heater ΔT as a function of Joule heating power at thermal equilibrium in the DBRs samples and a reference sample. The measured thermal conductivity of the porous GaN layers in the DBRs etched at 1.3 and 1.5 V were 6.96 and 3.29 W/m·K, respectively, resulting in an average thermal conductivity of 12.3 and 6.0 W/m·K in the porous DBR, respectively.

Example 6: Experimental Determination of Porous GaN Thermal Conductivities

Materials and Methods

Standard test samples for thermal conductivity measurement were prepared and consisted of an n$^+$-type GaN of 500 nm in thickness to be porosified according to designed parameters. Underneath highly-doped (N$_D$=1 to 15×10$^{19}$ cm$^{-3}$) GaN layers, a moderately-doped n-GaN layer (N$_D$=5× 10$^{18}$ cm$^{-3}$) with a thickness of 1 μm was grown to ensure uniform distribution of the anodization bias across the entire sample during the EC etching process.

After growth, the sample surface was covered with a silicon dioxide (SiO$_2$) layer through plasma-enhanced chemical vapor deposition (PECVD), which was then lithographically patterned into 100 μm wide stripes, separated by 10 μm openings. The sample was then dry-etched by Cl-based RIE to create vias/trenches and to expose the sidewalls of the highly-doped n$^+$-GaN layers. EC etching was done in an acid electrolyte at room temperature. A positive bias was applied on the sample by a source meter (Keithley 2400) while a Pt wire was used as a cathode. After EC etching, the protective SiO$_2$ was stripped off with buffered oxide etch (BOE).

Figure 12A:
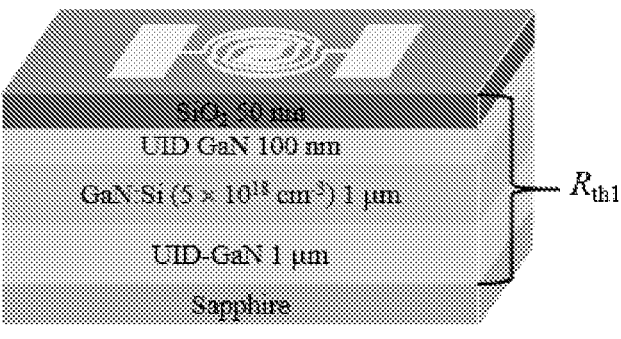
FIG. 12A is a non-limiting schematic cross-sectional representation of a reference sample structure used for thermal conductance/conductivity measurement.
Figure 12B:
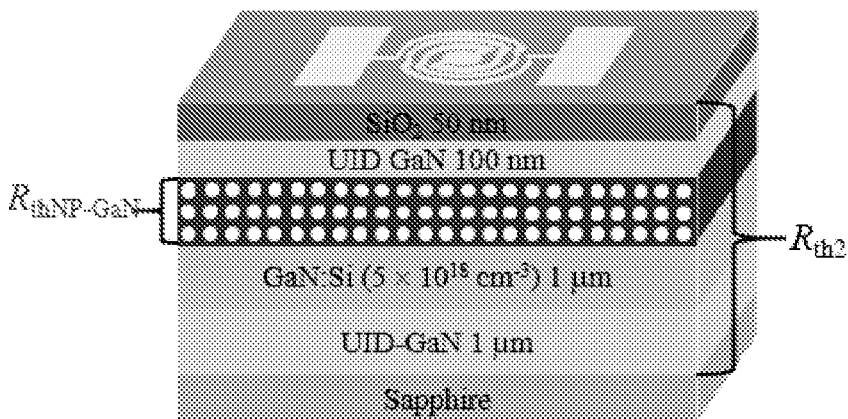
FIG. 12B is a non-limiting schematic cross-sectional representation of a sample structure of a porous —GaN used for thermal conductance/conductivity measurement.

The thermal conductivity was measured using a micro-fabricated heater-sensor pattern As shown in FIGS. 12A and 12B, to study the thermal conductivity of porous GaN, a differential temperature technique, where an 80-μm diameter, spiral Ni coil was patterned onto 8 samples (denoted A1-A3, B1-B2, and C1-C3), as well as a reference sample containing no p-GaN. A spiral metal coil with a radius of 40 μm was used as both a micro-heater and a resistivity-based temperature sensor. Before metal deposition, a 50 nm SiO$_2$ layer was deposited by PECVD as an electrical insulation layer between the heating element (Ni coil pattern) and the porous GaN thin films. A spiral coil pattern was obtained through E-Beam evaporation and a liftoff process of a 50 nm-thick nickel layer. A DC current was applied via the two contact pads at opposite ends of the spiral coil micro-heater and the resulting resistance was sensed by a four-wire measurement after a stabilization time of 100 seconds.

Characterization:

Three sets of porous GaN samples were prepared (denoted A1-A3, B1-B2, and C1-C3). The first two sets of samples had the same doping levels (B1-B2 and C1-C3) and an increase in the etching voltage resulted in an increase in porosity, while the pore wall thickness remained similar. This set of samples studied the dependence of thermal conductivity on porosity. The third set of samples (A1-A3) was designed to follow the iso-porosity curve near the low-porosity side of the EC etching phase diagram (see FIG. 4). With increasingly reduced doping concentration and increased applied bias at the same time, the porous GaN in the samples had increased wall thicknesses, while approximately having the same porosities.

The statistical results of porosity and average wall thickness for all these porous GaN samples (A1-A3, B1-B2, and C1-C3) and for DBR (1.3 V) and DBR (1.5 V) of Example 5 are summarized in Table 2.

TABLE 2

The extracted porosity and wall thickness data from the SEM images

| Sample | Doping concentration (cm$^{-3}$) | Applied bias (V) | Porosity (%) (±2) | Wall thickness (nm) (±2) |
|---|---|---|---|---|
| A1 | 8E19 | 1.25 | 30 | 5 |
| A2 | 2E19 | 2.0 | 21 | 14 |
| A3 | 1E19 | 3.0 | 10 | 31 |
| B1 | 1E20 | 1.8 | 62 | 6 |
| B2 | 1E20 | 2.5 | 74 | 6 |
| C1 | 4E19 | 1.3 | 24 | 10 |
| C2 | 4E19 | 1.5 | 36 | 8 |
| C3 | 4E19 | 2.0 | 51 | 7 |
| DBR (1-3V) | 4E19 | 1.3 | 24 | 10 |
| DBR (1-5V) | 4E19 | 1.5 | 36 | 8 |

Figures 13A, 13B, 13C:
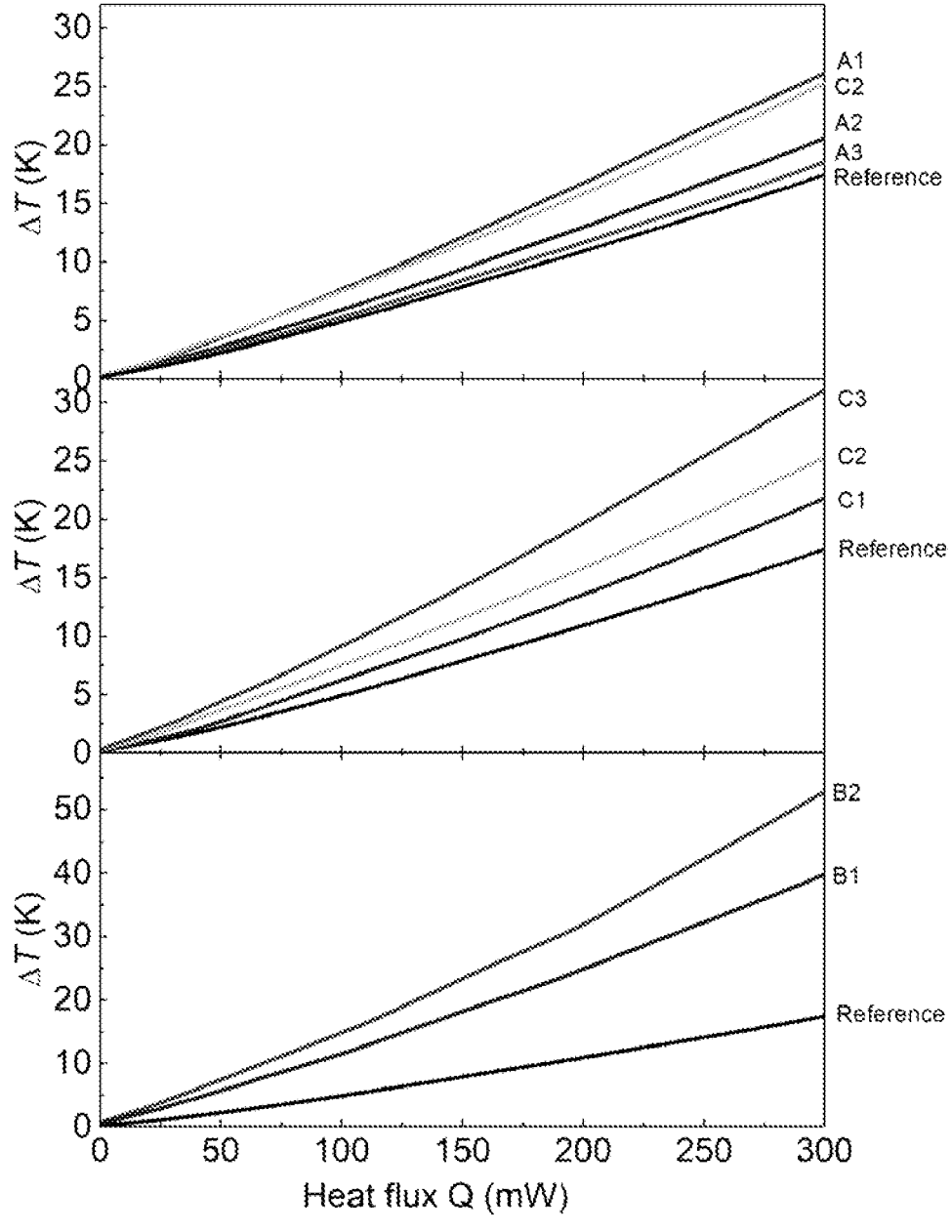
FIGS. 13A-13C are graphs of the temperature increases of the Ni micro-heater $\Delta T$ as a function of Joule heating power at thermal equilibrium in porous GaN samples (A1-A3, B1-B2, C1-C3), as well as a reference structure.

Thermal resistance of the test samples was determined with the knowledge of generated heat flux (controlled by the micro heater) and corresponding temperature increase ΔT (measured by the Ni-thermometer). The ΔT changed almost linearly with heat flux in the input power range (FIGS. 13A-13C). By calculating the difference between the thermal resistance across the reference and test samples (R$_{th1}$ and R$_{th2}$), respectively, the thermal resistance from the different porous GaN layers (R$_{th\ porous\text{-}GaN}$), was extracted, as summarized on Table 3. As presented, based on the porosity and wall thickness, the thermal conductivity of porous GaN can be varied from below 1 to more than 20 W/m·K. Such a strong dependence was expected when the feature size of the porous media was comparable or less than the phonon mean free path (MFP) in GaN crystal.

TABLE 3

The measured and calculated thermal conductivity (κ$_{porous\text{-}GaN}$) data obtained at the input power of 100 mW

| Sample | Measured κ$_{porous\text{-}GaN}$ from micro heater-sensor (W/m · K) | Calculated κ$_{porous\text{-}GaN}$ from effective medium model (W/m · K) |
|---|---|---|
| A1 | 3.37 | 4.0 |
| A2 | 9.45 | 10.1 |
| A3 | 24 | 25.2 |
| B1 | 1.27 | 1.7 |
| B2 | 0.83 | 1.1 |

TABLE 3-continued

The measured and calculated thermal conductivity ($\kappa_{porous-GaN}$) data obtained at the input power of 100 mW

| Sample | Measured $\kappa_{porous-GaN}$ from micro heater-sensor (W/m · K) | Calculated $\kappa_{porous-GaN}$ from effective medium model (W/m · K) |
|---|---|---|
| C1 | 7.23 | 7.9 |
| C2 | 3.18 | 4.0 |
| C3 | 2.24 | 2.6 |
| DBR (1.3V) | 6.96 | — |
| DBR (1.5V) | 3.29 | — |

Comparing the measured thermal conductivity using the microheater method with the calculated $\kappa_{eff}$ using a model, good agreement was observed between the experimental data and calculation results, which supports the estimated thermal conductivity values for porous GaN from the model. A somewhat abrupt, upward transition of experimental thermal conductivity values from A1 to A3 was observed as porosity reduced which was attributed to the additional effect of an increase of wall thickness between pores.

The large tunability of thermal conductivity by changing porous GaN's physical parameters, especially the porous GaN's wall thickness was noted. A reduction in porosity leads to a moderate improvement in thermal conductivity, as a result of an increased effective medium. Widening the pore wall thickness also improved the thermal conductivity owing to much reduced phonon interaction at the pores. For porous GaN layers with large wall thicknesses and small porosities, the thermal conductivity is capable of reaching to more than 20 W/m·K, which is important for applications, such as in photonic devices, requiring fast heat dissipation.

Example 7: High Reflectance Porous GaN/GaN DBR Mirrors

Materials and Methods

A distributed Bragg reflector (DBR) mirror made of GaN/porous GaN was prepared. First an epitaxial structure consisting of alternating n$^+$-GaN/GaN layers was grown by metal organic chemical vapor deposition (MOCVD). EC etching was performed laterally and the GaN was lithographically patterned with vias/trenches (via windows) to expose the sidewalls of the alternating layers. The vias/trenches were created by inductively coupled plasma reactive-ion etching (ICP-RIE). The top of the sample surface was covered by SiO$_2$, while the edge (not shown) was connected to a source meter so the anodic bias could be applied. EC etching was conducted where lateral porosification proceeded from the exposed sidewalls in the direction perpendicular to the sidewall surface to form parallel pores.
Characterization:

Optical microscopy (not shown) and scanning electron microscopy (Hitachi SU-70) was used to study the GaN/porous-GaN DBR DBR mirror structure.

Figure 14:
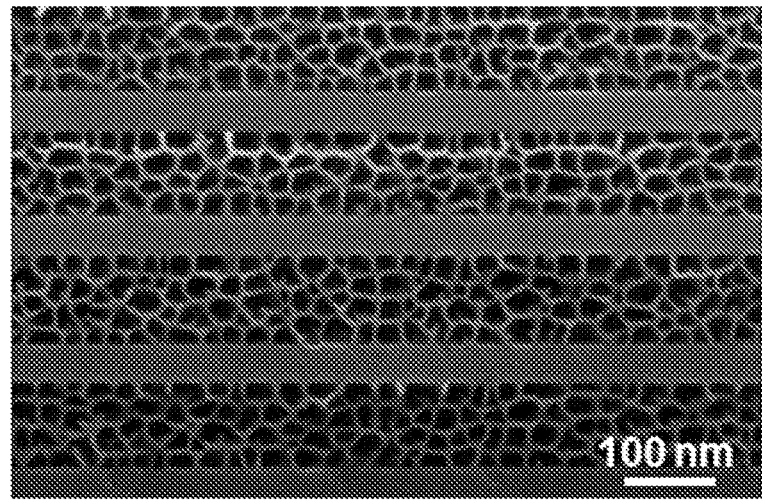
FIG. 14 is a cross-sectional SEM image of a multilayer GaN/porous-GaN DBR structure.

As shown in FIG. 14, mesoporous GaN was formed laterally in the doped n$^+$-GaN layers. The rate of lateral porosification was approximately 5 μm/min. The area of the DBR region easily exceeds 50 μm, which is sufficiently large for the fabrication of VCSELs. Cross-sectional scanning electron microscopy (SEM) imaging of the porous GaN DBR near the center of the cross-shaped alignment mark was taken (not shown) and a closeup SEM image of the same structure showed that the porous GaN had a porosity of apparently 70% and an average pore size of 30 nm. The DBR mirror structure was formed by the conductivity-based selectivity in EC porosification which cannot be accomplished by any other means including photo-assisted electrochemical (EC) process.

The reflectance spectrum of the GaN/porous-GaN DBR mirror was measured with a micro-reflectance setup calibrated against a commercial silver mirror with a spot size of 20 μm. The reflectance of sapphire was measured and compared to known values and it was determined that the accuracy was within 0.1%. As shown in FIG. 15A shows the reflectance trace (solid line) of a GaN/porous-GaN DBR with a stopband centered at approximately 520 nm. COMSOL simulated reflectance is shown as a dotted line based on the cross-sectional SEM image in FIG. 14 scanned digitally as an input file for the simulation. The difference between the simulation and measured results is believed to result from the relatively large numerical aperture (around 0.34) used in the reflectance measurement. Nevertheless, a peak reflectance of more than 99.5% is reproducibly obtained with a stopband of at least 70 nm (not shown). The peak reflectance recorded is among the highest found to-date from a III-nitride epitaxial DBR structure, and the full width at half maximum (FWHM) is nearly one order of magnitude wider.

Example 8: Controllability of the Porosity in a GaN DBR

Materials and Methods

To demonstrate the controllability of the mesoporous GaN DBR, two parameters were systematically varied. First, the as-grown structures were used but an anodic bias voltage of 1-5 V was applied to change the porosity.
Characterization:

Varying the porosity from 40 to 75% caused detuning by changing the refractive index and the Bragg condition; the peak wavelength of the stopband could be varied by up to 30 nm for a blue GaN/porous-GaN DBR (FIG. 15B). Separately, three structures with different thicknesses were prepared but where the structures had the same doping by metal organic chemical vapor deposition (MOCVD). Highly reflective (>99.5%) DBR mirrors in the blue (440 nm), green (520 nm), and red (600 nm) wavelength range were prepared according to this process (FIG. 16).

Example 9: DBR Mirror with Gradient Doping Profiles

Materials and Methods

A 20-pair porous DBR with a targeted wavelength at 420 nm was fabricated according to the methods described. The DBR mirror had graded doping layers from $5\times10^{18}$ to $1\times10^{20}$ cm$^{-3}$ with a thickness of 30 nm between the porous GaN and bulk GaN layers. The DBR structure was EC etched at 1.5V.

Figure 17A:
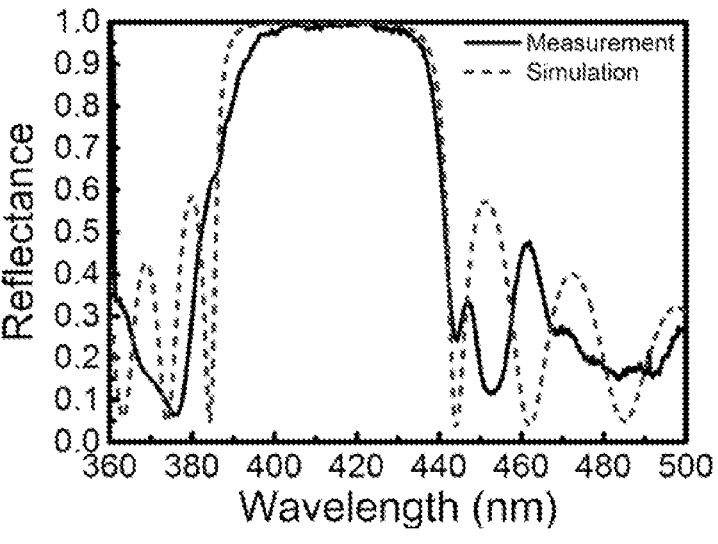
FIG. 17A is a graph of the reflectance spectrum of porous-DBR (black solid: experimental measurement; dotted: computer simulation).

Using the same stripe mesa configuration as in FIG. 7A, the electrical transport property of the graded DBR structure was measured.
Characterization:

The porous GaN layers of the DBR had a porosity of approximately 47% and were calculated to have an effective refractive index of 1.89 based on the volume average theory which represents a refractive index contrast of apparently 0.65. The reflectance spectrum of the porous-DBR is shown in FIG. 17A.

The peak reflectance was approximately 99.5% with a center wavelength at apparently 415 nm and a stopband with R>90% of more than 50 nm. There was a general agreement in the position and stop bandwidth between simulation (not shown) and experiments.

Figure 17B:
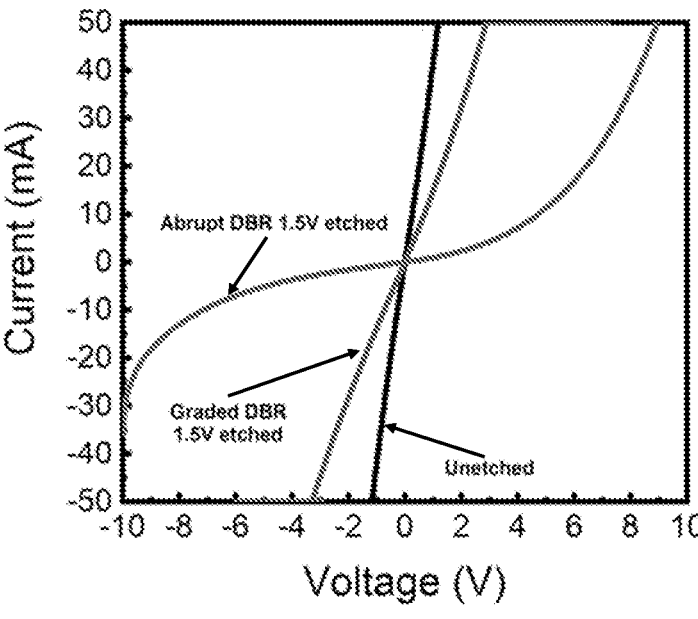
FIG. 17B is a graph showing the current-voltage (I-V) characteristic of a 20 pair graded DBR etched at 1.5 V in comparison with an abrupt DBR etched at 1.5 V, as well as a reference unetched DBR.

The I-V characteristic of the graded DBR mirror are shown in FIG. 17B. Compared to the nonlinear I-V of the abrupt DBR, the graded DBR showed a significant improvement in Ohmic-like I-V behavior. The resistance of the graded DBR was approximately 3 times higher than that of an unetched DBR. Although the average resistivity (apparently 0.05 Ohm-cm) of the 20 pair graded DBR was higher than that of the 100 nm graded single porous GaN layer, it was sufficiently low to support current flow when incorporated into a photonic device, such as a practical VCSEL device.

Example 10: Optically Pumped Vertical-Cavity Surface-Emitting Laser Using a Porous-GaN DBR

Materials and Methods

A planar InGaN microcavity using a porous-GaN DBR structure as the bottom mirror was constructed. The microcavity for optical pumping was completed with 10 $In_{0.15}Ga_{0.85}N$ (3 nm)/GaN (8 nm) quantum wells ($\lambda_{PL}$=450 nm) capped with 12 pairs of dielectric $SiO_2/TiO_2$ layers as the top mirror. The cavity was designed to have an overall effective length of 3λ and the InGaN MQW was centered at an antinode. Optical pumping was performed with a 355 nm pulsed laser (pulse duration is 0.5 ns and pulse rate is 1 kHz) with a spot size of ~5 μm.

Figure 18A:
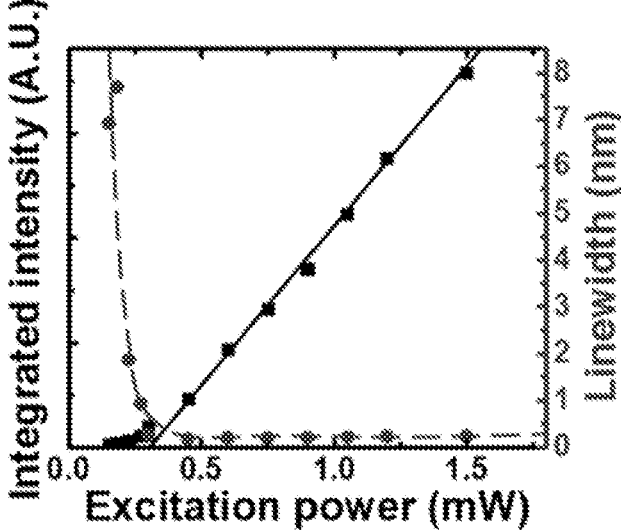
FIG. 18A is a graph of the laser output intensity (squares; left y-axis) and linewidth (circles; right y-axis) as functions of the excitation power (x-axis.
Figure 18B:
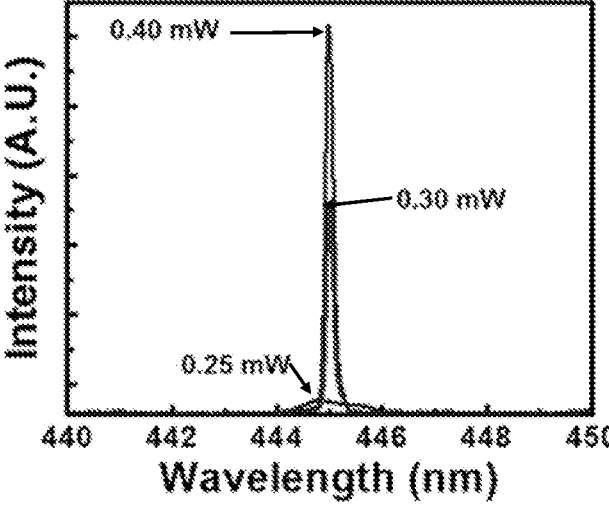
FIG. 18B is a graph of the output spectra at different excitation powers (below, at and above threshold) originated from an optically pumped micro-cavity with a GaN/porous-GaN bottom DBR and a dielectric top DBR.

An all-nitride optically pumped blue VCSEL with two porous GaN/GaN DBRs was also constructed with two 10-pairs of porous GaN DBRs sandwiching a 10 InGaN/GaN quantum wells (QWs). Optical pumping was performed with a 355 nm pulsed laser (pulse duration is 0.34 ns and pulse rate is 1 kHz).
Characterization:

As shown in FIG. 18A the output intensity and linewidth are functions of the excitation power with a clear lasing threshold observed at the power density of 1.5 kW/cm². FIG. 18B shows the output spectra at different excitation powers (below, at and above threshold). Single mode lasing was achieved at 445 nm with a linewidth of 0.17 nm. A lasing quality (Q) factor of more than 3,000 was determined and a below-threshold (cold cavity) Q-factor of around 500 was found. The presence of surface-emitting laser action was further established from a far-field (40 cm away) spot pattern (not shown) showing a nearly circular beam profile. The demonstration of such a porous-DBR based optically pumped VCSEL confirmed the excellent optical property of the porous-GaN DBR and verified the viability of the integration of porous-DBR to realize a blue (vertical-cavity surface-emitting laser) VCSEL device.

Figure 19:
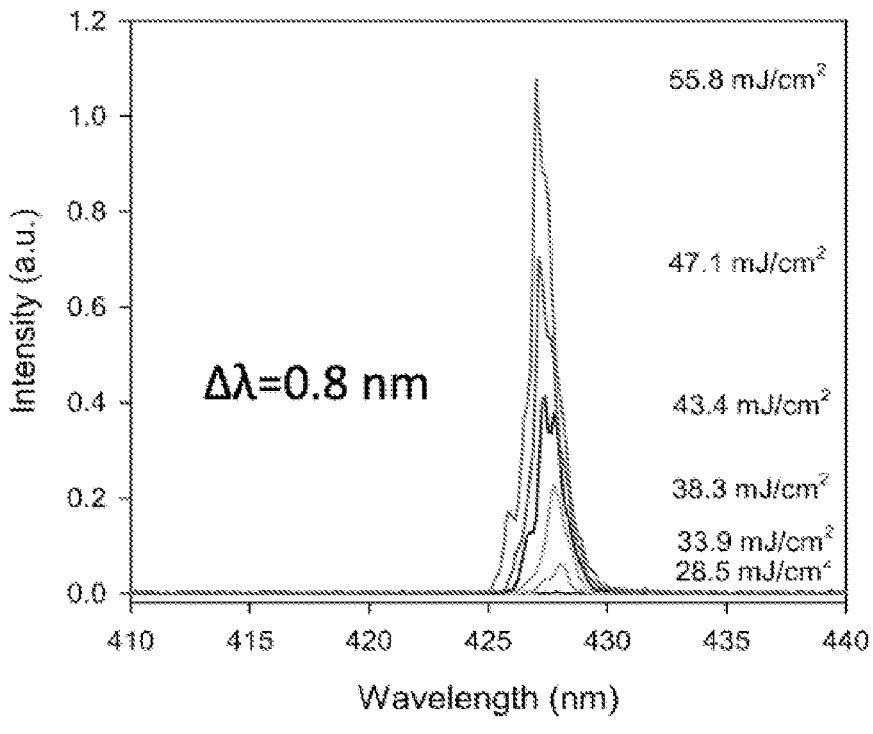
FIG. 19 is a graph showing the output spectra of an optically pumped all-nitride VCSEL at different excitation powers (below, at and above threshold).

For the all-nitride optically pumped blue VCSEL, the output intensity as a function of the excitation power with a lasing threshold was observed at the energy density of 32.3 mJ/cm². The lasering action was also evidenced by the comparison in near-field pattern (not shown) before and after lasing threshold, with a clear lasing spot showing up after reaching threshold. The spectra of the optically pumped all-nitride VCSEL are shown in FIG. 19. Thus, the concept of using double porous-DBR with a tunnel junction as a conductive spreading layer on the p-side of a VCSEL is very attractive because of the structural simplicity and improved current injection scheme.

Unless defined otherwise, all technical and scientific terms used herein have the same meanings as commonly understood by one of skill in the art to which the disclosed invention belongs. Publications cited herein and the materials for which they are cited are specifically incorporated by reference.

Those skilled in the art will recognize, or be able to ascertain using no more than routine experimentation, many equivalents to the specific embodiments of the invention. Such equivalents are intended to be encompassed by the following claims.

We claim:

1. A multilayer structure comprising
a porous III-nitride layer comprising a plurality of pores therein, wherein the porous III-nitride layer is doped with an n-type dopant and the concentration of the n-type dopant changes across the layer in a doping gradient function over a defined thickness within the layer;
at least one layer of a bulk non-porous III-nitride,
wherein the porous III-nitride layer forms an interface with the at least one layer of a bulk non-porous III-nitride;
wherein the bulk non-porous III-nitride layer is doped with n-type dopant;
wherein a doping gradient extends across the interface between the porous III-nitride layer and the bulk non-porous III-nitride layer;
wherein the doping gradient has a concentration of the n-type dopant which changes over a thickness of between about 5 to 100 nm, 5 to 75 nm, 5 to 50 nm, or 5 to 25 nm at the interface with the n-type dopant concentration changing from $5\times10^{18}$ cm$^{-3}$ to $1\times10^{20}$ cm$^{-3}$ in an optionally linear manner;
wherein the doping gradient extending across the interface reduces current blocking between the porous III-nitride layer and the bulk non-porous III-nitride layer;
wherein morphology of the pores of the plurality is a function of the doping gradient; and
wherein the thickness of the doping gradient defines a depletion region within the interface between the porous III-nitride layer and the bulk non-porous III-nitride layer.

2. The multilayer structure of claim 1, wherein the porous III-nitride layer and the bulk non-porous III-nitride layer are independently formed of aluminum nitrides, gallium nitrides, indium nitrides, and alloys thereof.

3. The multilayer structure of claim 1, wherein porosity of the porous III-nitride layer changes, as a function of the doping gradient concentration and ranges between about 10% and 90% or 20% and 80%, and optionally there is no porosity outside of the doping gradient.

4. The multilayer structure of claim 1, wherein the porous III-nitride layer and the bulk non-porous III-nitride layer each have different indices of refraction and have a refractive index contrast;
wherein the refractive index contrast (Δn) is greater than 0.4 or greater than 0.5.

5. A device comprising the multilayer structure of claim 1.

6. The device of claim 5, wherein the device is a distributed Bragg reflector mirror.

7. The device of claim 6, wherein the distributed Bragg reflector mirror forms part of a vertical cavity surface-emitting laser.

8. The multilayer structure of claim 1, wherein the n-type dopant is present at a concentration range of between about $5 \times 10^{18}$ $cm^{-3}$ to $1 \times 10^{20}$ $cm^{-3}$.

9. The multilayer structure of claim 1, wherein the plurality of pores are columnar pores, which are optionally vertically or laterally aligned.

10. The multilayer structure of claim 9, wherein the columnar pores are vertically or laterally aligned pores and each have average lengths of about 5 to 1000 nm, 5 to 900 nm, 10 to 800 nm, 10 to 700 nm, 10 to 600 nm, 10 to 500 nm, 10 to 400 nm, 10 to 300 nm, 10 to 200 nm, 10 to 100 nm, or 10 to 50 nm.

11. The multilayer structure of claim 1, wherein the doping gradient changes in a linear manner.

12. A method of making the multilayer structure of claim 1, the method comprising the steps of:

(a) providing or depositing one or more layers of a III-nitride; wherein at least one of the layers of a III-nitride is doped with an n-type dopant; and (b) electrochemically (EC) etching the at least one layer of III-nitride which is doped with the n-type dopant in the presence of an electrolyte and under an applied bias voltage to form a plurality of pores therein;

wherein the one or more layers of III-nitride comprises both doped and unintentionally doped III-nitride layers;

wherein there is a doping gradient at interfaces between different interfacing doped and unintentionally doped III-nitride layers;

wherein the doping gradient extends across the interfaces between the interfacing doped and unintentionally doped III-nitride layers;

wherein the doping gradient has a concentration of the n-type dopant that changes over a thickness of between about 5 to 100 nm, 5 to 75 nm, 5 to 50 nm, or 5 to 25 nm at the interfaces with the n-type dopant concentration changing from $5 \times 10^{18}$ $cm^{-3}$ to $1 \times 10^{20}$ $cm^{-3}$ in a linear manner;

wherein the doping gradient extending across the interfaces reduces current blocking between the interfacing doped and unintentionally doped III-nitride layers;

wherein morphology of the pores of the plurality is a function of the doping gradient; and wherein the thickness of the doping gradient defines a depletion region within the interfaces.

13. The method of claim 12, wherein the III-nitride is selected from aluminum nitrides, gallium nitrides, indium nitrides, and alloys thereof.

14. The method of claim 12, wherein the one or more layers of III-nitride is epitaxially or homoepitaxially grown by metal organic chemical vapor deposition (MOCVD).

15. The method of claim 12, wherein the one or more layers of III-nitrides comprise undoped III-nitride layers.

16. The method of claim 12, wherein the n-type dopant is a Ge dopant, Si dopant, or a combination thereof.

17. The method of claim 12, wherein the doping concentration of the one or more layers of III-nitride are each independently in a range of between about $0.5 \times 10^{20}$ $cm^{-3}$ to $10 \times 10^{20}$ $cm^{-3}$; and/or in a range of between about $1 \times 10^{19}$ $cm^{-3}$ to less than $1 \times 10^{20}$ $cm^{-3}$ or in a range of between about $0.5 \times 10^{19}$ $cm^{-3}$ to $10 \times 10^{19}$ $cm^{-3}$; and/or in a range of between about $0.5 \times 10^{18}$ $cm^{-3}$ to $10 \times 10^{18}$ $cm^{-3}$.

18. The method of claim 12, wherein the electrolyte is selected from hydrofluoric acid, nitric acid, or organic acids.

19. The method of claim 12, wherein the applied bias voltage is in a range of between about 0.1 to 10 V, 1.0 to 5V, or 1.0 to 2.5V and is applied for at least about 5 min, 10 min, 15 min, 20 min, 25 min, 30 min, 35 min, 40 min, 45 min, 50 min, 55 min, or 60 min.

20. The method of claim 12, wherein the plurality of pores are columnar pores, which are optionally vertically or laterally aligned.

\* \* \* \* \*